(12) United States Patent
Ueno

(10) Patent No.: US 7,423,558 B2
(45) Date of Patent: Sep. 9, 2008

(54) DIGITAL/ANALOG CONVERSION CIRCUIT

(75) Inventor: Yosuke Ueno, Kanagawa (JP)

(73) Assignee: Sony Corporation (JP)

( * ) Notice: Subject to any disclaimer, the term of this patent is extended or adjusted under 35 U.S.C. 154(b) by 0 days.

(21) Appl. No.: 11/709,159

(22) Filed: Feb. 22, 2007

(65) Prior Publication Data

US 2007/0216559 A1    Sep. 20, 2007

(30) Foreign Application Priority Data

Feb. 28, 2006    (JP) .............................. 2006-052704

(51) Int. Cl.
*H03M 7/00*    (2006.01)
(52) U.S. Cl. .......................................... 341/50; 341/144
(58) Field of Classification Search .................... 341/50, 341/144, 143
See application file for complete search history.

(56) References Cited

U.S. PATENT DOCUMENTS 6,917,321 B1 *  7/2005  Haurie et al. ................ 341/144

OTHER PUBLICATIONS

Fumio Ueno et al., Reduction Methods of Capacitor Mismatch Errors In Switched-Capacitor A/D, D/A Converters: ISCAS'88, Faculty of Engineering, Kumamoto University, pp. 2813-2816, Japan, 1988.
L. Weyten et al., "Two-capacitor DAC with compensative switching", Electronics Letter, 1995, vol. 31, pp. 1435-1437.

* cited by examiner

*Primary Examiner*—Rexford Barnie
*Assistant Examiner*—Joseph Lauture
(74) *Attorney, Agent, or Firm*—Rader Fishman & Grauer PLLC; Ronald P. Kananen

(57) ABSTRACT

A digital/analog conversion circuit includes a plurality of capacitors, a voltage application section, a connection section, and a control section. The control section is operable to perform the charge sharing operation and to collect the charge supplied from the voltage application section. The control section sets, for at least M higher order ones of the digits of the binary code, the number of times by which the one capacitor takes part in the charge sharing operation within a series of operations before the charge supplied from the voltage application section by the voltage application operation is shared by the last charge sharing operation to twice the number of times by which the one capacitor takes part in the voltage application operation or the charge retaining operation, M being an integer equal to or greater than two.

5 Claims, 14 Drawing Sheets

DIGITAL/ANALOG CONVERSION CIRCUIT

CROSS REFERENCES TO RELATED APPLICATIONS

The present invention contains subject matter related to Japanese Patent Application JP 2006-052704 filed with the Japanese Patent Office on Feb. 28, 2006, the entire contents of which being incorporated herein by reference.

BACKGROUND OF THE INVENTION

1. Field of the Invention

This invention relates to a digital/analog conversion circuit, and more particularly to a cyclic digital/analog conversion circuit.

2. Description of the Related Art

A digital/analog converter (hereinafter referred to simply as DAC) is a circuit for converting a digital signal which has been subject to various digital processes into an analog signal so as to be outputted as a real signal, and is one of basic components of electric apparatus. The DAC is used widely in television receivers, audio apparatus, communication apparatus and so forth. In the apparatus mentioned, the DAC is used as a circuit for converting a digital signal which has been subject, for example, to an image process or a sound process into an analog signal to be outputted to a display unit or a speaker. Further, the DAC is used as a circuit for converting a digital signal which has been subject to various coding and/or decoding processes into an analog signal to be signaled to a communication line.

Various performances which may be required for the DAC differ depending upon the application, and small area occupation and low current consumption are representative ones of the performances. For example, in a driver application for a liquid crystal display (LCD) unit, a number of DACs equal to the number of columns of the LCD unit may be required. Where the number is great, it reaches approximately 1,000, and therefore, small area occupation and low power consumption of the individual DACs provide significant merits.

As one of DACs which satisfy small area occupation and low power consumption, a cyclic DAC is known since the olden times of the 1970's.

FIG. 13 shows an example of a configuration of a general cyclic DAC. Referring to FIG. 13, the cyclic DAC shown is basically composed of two capacitors (C21 and C22) having an equal electrostatic capacitance and switches (SW31, SW32, SW33 and SW34), and digital/analog converts a serial bit string.

Action of the cyclic DAC is described briefly with reference to FIG. 13.

The switch SW31 selects and outputs a voltage corresponding to an input bit to the switch SW32. For example, the switch SW31 selects a reference voltage ($V_{ref}$) when the value of the input bit is "1", but selects the ground (GND) when the value of the input bit is "0".

The switch SW32 plays a role of sampling. When the switch SW32 is on, a voltage corresponding to the input bit value is applied to the capacitor C21 through the switches SW31 and SW32. At this time, the switch SW33 is in an off state, and a previous voltage is held in the capacitor C22.

The switch SW33 plays a role of charge-sharing. If the switch SW33 is switched on, then the capacitors C21 and C22 are connected in parallel, and charge accumulated in the two capacitors C21 and C22 is shared equally. This implements an arithmetic operation of ½ multiplication which is most significant in digital/analog conversion.

The switch SW34 implements resetting of the charge of the capacitor C22.

FIG. 14 illustrates sampling and charge sharing action of the cyclic DAC shown in FIG. 13.

Referring to FIG. 14, in order to sample charge in accordance with an input bit value into the capacitor C21, the switch SW32 is switched on and the switch SW33 is switched off while the switch SW31 selects a voltage corresponding to the input bit value. For example, when the input bit value is "1" as seen in FIG. 14, the switch SW31 selects the reference voltage $V_{ref}$, and the capacitor C22 receives the reference voltage $V_{ref}$ as an input thereto through the switch SW32. At this time, the switch SW33 is in an off state, and consequently, the capacitor C22 holds a previous voltage $V_x$.

After the sampling is completed, the switch SW32 is switched off and the switch SW33 is switched on so that the capacitors C21 and C22 are connected in parallel. Since the capacitors C21 and C22 have an equal electrostatic capacitance, one half of the entire charge is shared out to each of the capacitors C21 and C22, and the voltage of each of the capacitors C21 and C22 is substantially equal to $(V_{ref}+V_x)/2$. When a next sampling is performed by the capacitor C21, a result of the preceding charge sharing is retained in the capacitor C22.

As described hereinabove, the cyclic DAC shown in FIG. 13 successively samples charge in accordance with the input bit value into the capacitor C21 and successively charges, in parallel to the sampling action, one half of the sum of the charge retained already in the capacitor C22 and the charge sampled newly into the capacitor C21 into the capacitor C22.

This action of the cyclic DAC can be represented by such a feedback system as seen in FIG. 15.

In the feedback system shown in FIG. 15, a multiplication section 102 multiplies an addition result outputted from an addition section 101 by ½. A delay section 103 retains a result of the multiplication of the multiplication section 102 and outputs the retained multiplication result to the addition section 101 when an arithmetic operation is to be performed by the addition section 101. The addition section 101 arithmetically operates the sum of a signal successively inputted for each bit and the output signal of the delay section 103.

Where the bits of the input bit string (L bits) are individually represented by D1, D2, D3, ..., DL in order from the LSB side, the output voltage $V_{out}$ of the cyclic DAC shown in FIG. 13 is represented ideally by the following expression (1):

$$V_{out} = \left(\left(\left(\cdots\left(\left(D_1 \cdot \frac{1}{2} + D_2\right) \cdot \frac{1}{2} + D_3\right) \cdot \frac{1}{2} + \cdots + D_{L-2}\right) \cdot \frac{1}{2} + D_{L-1}\right) \cdot \frac{1}{2} + D_L\right) \cdot \frac{1}{2} \cdot V_{ref} \quad (1)$$

$$= \left(\frac{1}{2}D_L + \frac{1}{2^2}D_{L-1} + \frac{1}{2^3}D_{L-2} + \cdots + \frac{1}{2^{L-1}}D_2 + \frac{1}{2^L}D_1\right) \cdot V_{ref}$$

$$= V_{ref} \cdot \sum_{k=1}^{L} \frac{D_k}{2^{L-k-1}}$$

From the expression (1), it can be recognized that digital/analog conversion can be implemented certainly by the cyclic DAC having the configuration described hereinabove with reference to FIG. 13.

Incidentally, the maximum effective bit number (effective number of bits: ENOB) of the cyclic DAC normally depends upon a mismatch in electrostatic capacitance of two capacitors (C21 and C22). In particular, the electrostatic capacitances of the two capacitors do not fully coincide with each other, and this makes a factor of restricting the ENOB. Where the capacitance values of the capacitors C21 and C22 are represented by "A" and "B", the output voltage $V_{out}$ of the cyclic DAC represented by the expression (1) can be represented as given by the following expression (2):

$$V_{out} = V_{ref} \cdot \sum_{k=1}^{L} \frac{AB^{L-k}}{(A+B)^{L-k+1}} D_k \quad (2)$$

Here, if the electrostatic capacitance B is represented by "B=A×(1+x)" and the mismatch of the electrostatic capacitances A and B is represented by a variable x, then the output voltage $V_{out}$ of the cyclic DAC represented by the expression (2) can be represented by the following expression (3):

$$V_{out} = V_{ref} \cdot \sum_{k=1}^{L} \frac{(1+x)^{L-k}}{(2+x)^{L-k+1}} D_k \quad (3)$$

From the difference between the expressions (3) and (1), the error amount $\Delta V_{out}$ of the output voltage $V_{out}$ by the mismatch between the electrostatic capacitances A and B can be represented as given by the following expression (4):

$$\Delta V_{out} = V_{ref} \cdot \sum_{k=1}^{L} \left\{ \frac{(1+x)^{L-k}}{(2+x)^{L-k+1}} - \frac{1}{2^{L-k+1}} \right\} \cdot D_k \quad (4)$$

FIG. 16 illustrates a relationship between the error amount $\Delta V_{out}$ and input data where the bit length L is L=11 and the mismatch x is x=0.002 (0.2%). The axis of abscissa indicates the value of the input data expressed in the decimal notation, and the axis of ordinate indicates the error amount $\Delta V_{out}$ normalized with the voltage value ($V_{ref}/2^L$) of 1 LSB.

As can be seen from the result illustrated in FIG. 16, the error amount $\Delta V_{out}$ with regard to the input data of a particular value is greater than 1 LSB. Accordingly, where the mismatch x in electrostatic capacitance is 0.2%, the ENOB exhibits a limit at approximately nine bits.

In recent years, together with reduction in the area and increase of the operating speed of digital circuits, signals of a progressively high resolution, that is, of an increasing number of bits, are handled. This inevitably may require a higher ENOB for DACs. Further, since to provide a sufficient ENOB performance to DACs provides enhancement in withstanding property against a production dispersion of circuit characteristics, this contributes also to enhancement of the yield of circuits. Accordingly, also for cyclic DACs, it is demanded to implement a higher ENOB which exceeds a limit to the ENOB provided by a mismatch in electrostatic capacitance.

Various DACs directed to increase of the ENOB are known and disclosed, for example, in "Reduction Methods of Capacitor Mismatch Errors In Switched-Capacitor A/D, D/A converters", ISCAS'88, United States, June 1888, Vol. 3, p. 2813 to 2816 (hereinafter referred to as Non-Patent Document 1). Another DAC is disclosed in "Two-capacitor DAC with compensative switching", Electronics Letter, United States, 1995, Vol. 31, p. 1435 to 1437 (hereinafter referred to as Non-Patent Document 2).

In particular, Non-Patent Document 1 proposes a cyclic DAC which additionally includes a sequence for detecting and correcting a mismatch in electrostatic capacitance.

FIG. 17 illustrates the correction sequence.

Referring to FIG. 17, a capacitance mismatch between two capacitors C21 and C22 is detected, and if the capacitance mismatch is higher than a fixed value, then a very small capacitor is added to that one of the capacitors C21 and C22 which has a lower capacitance value (in the example of FIG. 17, the capacitor C21). Then, a capacitance mismatch between the two capacitors is detected, and if the mismatch is still higher than the fixed value, then another very small capacitor is added. Such a sequence as just described is repeated until the mismatch becomes lower than the fixed value. Thereafter, digital/analog conversion action is performed.

On the other hand, Non-Patent Document 2 proposes a technique which does not involve correction of a capacitance mismatch itself but adopts a compensative switching method which performs switching so as to cancel an effect of a mismatch.

FIG. 18 shows an example of a configuration of a cyclic DAC which performs digital/analog conversion using the compensative switching method. Referring to FIG. 18, the cyclic DAC shown includes capacitors C21 and C22, switches SW35 and SW36 for applying a reference voltage $V_{ref}$ to the capacitors C21 and C22, respectively, switches SW37 and SW38 for resetting charge of the capacitors C21 and C22, respectively, and a switch SW39 for connecting the capacitors C21 and C22 in parallel. In the cyclic DAC shown in FIG. 18, since sampling switches are provided individually for the two capacitors C21 and C22, any of the capacitors C21 and C22 can be used for sampling.

According to the compensative switching method, an error caused by a mismatch in electrostatic capacitance is compensated for by performing sampling, which is usually performed by one of two capacitors (in the cyclic DAC shown in FIG. 13, the capacitor C21), using both capacitors. In particular, for each bit of an input bit string, a cumulative error by mismatches at the inputting timing is calculated, and a capacitor of an object of sampling is selected so that the error produced by the sampling of the bit may cancel the cumulative error until then.

SUMMARY OF THE INVENTION

According to the correction sequence of Non-Patent Document 1 described above, the capacitance mismatch between two capacitors used in a cyclic DAC decreases, resulting in increase of the ENOB. However, the increase of the ENOB by the correction sequence is restricted by a plurality of factors. For example, in order to enhance the correction accuracy, the very small capacitor to be added has to have a sufficiently low value. However, this in turn increases the number of times of repetition of the correction sequence, resulting in a disadvantage that increased time may be required for correction of the capacitance mismatch. A more significant problem is that, as the value of the very small capacitor to be added becomes lower, the detection accuracy of the capacitance mismatch has to be raised. In other words, the correction accuracy of the capacitance mismatch is limited by the accuracy of a detector for the capacitance mismatch such as, for example, a voltage comparator. This makes a significant factor which obstructs an increase of the ENOB.

On the other hand, according to the compensative switching method of Non-Patent Document 2, by selecting a capacitor of a sampling object so as to cancel a cumulative error, an average error of an output voltage can be reduced even if a capacitance mismatch exists. However, this technique has two problems. A first one of the problems resides in that the DAC operates in accordance with the dynamic sequence wherein a capacitor is selected for each input bit. This significantly complicates a circuit for the switching control and besides gives rise to a secondary problem of charge injection and so forth. The second problem is that an average error is reduced by the technique. In other words, even where the technique of Non-Patent Document 2 is used, the ENOB may not be improved because the maximum value of the error of the output voltage is the same as that by existing techniques.

Therefore, it is desirable to provide a cyclic digital/analog conversion circuit which can reduce a conversion error caused by a mismatch in electrostatic capacitance between capacitors.

According to an embodiment of the present invention, there is provided a digital/analog conversion circuit including a plurality of capacitors having electrostatic capacitances substantially equal to each other, a voltage application section configured to apply a first voltage or a second voltage to each of the capacitors, a connection section configured to select a capacitor pair from among the capacitors and connect the selected capacitors in parallel, and a control section configured to control the voltage application section and the connection section in accordance with a predetermined operation sequence including a voltage application operation of applying the first voltage or the second voltage to one of the capacitors in response to the value of a Kth digit of a binary code of a bit length L, L being an integer equal to or greater than three, K being an integer within a range from one to L wherein the first digit is the least significant bit of the binary code, a charge sharing operation of connecting two ones of the capacitors including the one capacitor in parallel to share the charge accumulated in the one capacitor to the two capacitors, a charge retaining operation of disconnecting the two capacitors connected in parallel from each other and retaining the charge accumulated in the other one of the two capacitors, and an initialization operation of initializing the voltage of the one capacitor to the second voltage; the control section being operable to perform the charge sharing operation by (L−K+N) times for the charge supplied from the voltage application section by the voltage application operation for the Kth digit of the binary code, N being an integer equal to or greater than two, and to collect the charge supplied from the voltage application section by the voltage application operations for the digits of the binary code into a common one of the capacitors before the last charge sharing operation of the operation sequence; the control section setting, for at least M higher order ones of the digits of the binary code, the number of times by which the one capacitor takes part in the charge sharing operation within a series of operations before the charge supplied from the voltage application section by the voltage application operation is shared by the last charge sharing operation to twice the number of times by which the one capacitor takes part in the voltage application operation or the charge retaining operation, M being an integer equal to or greater than two.

The digital/analog conversion circuit may be configured such that the capacitors include a first capacitor, a second capacitor and a third capacitor and the predetermined operation sequence includes: a first sequence, a second sequence and a third sequence; and in the first sequence, the control section applies a voltage to the first capacitor by the voltage application operation for the (L−2)th digit of the binary code; performs, after the voltage application, charge sharing by parallel connection of the first capacitor; and the second capacitor, performs, after the charge sharing operation, charge retaining of the first capacitor; and initialization of the second capacitor, performs, after the initialization operation, charge sharing by parallel connection of the first capacitor and the second capacitor; performs, after the charge sharing operation, application of a voltage to the first capacitor by the voltage application operation for the Lth digit of the binary code and charge retaining of the second capacitor; performs, after the voltage application operation, charge sharing by parallel connection of the first capacitor and the second capacitor; and performs, after the charge sharing operation, charge retaining of the second capacitor; in the second sequence, the control section performs application of a voltage to the second capacitor by the voltage application operation for the (L−1)th digit of the binary code; performs, after the voltage application operation, charge sharing by parallel connection of the second capacitor; and the third capacitor; performs, after the charge sharing operation, charge retaining of the third capacitor and initialization of the first capacitor, performs, after the initialization operation, charge sharing by parallel connection of the third capacitor and the first capacitor; and performs, after the charge sharing operation, charge retaining of the first capacitor; and in the third sequence, the control section performs charge sharing by parallel connection of the second capacitor into which the charge is retained at the last end of the first sequence and the first capacitor into which the charge is retained at the last end of the second sequence.

With the digital/analog conversion circuit, the conversion error caused by a mismatch in electrostatic capacitance between capacitors used therein can be reduced.

The above and other objects, features and advantages of the present invention will become apparent from the following description and the appended claims, taken in conjunction with the accompanying drawings in which like parts or elements denoted by like reference symbols.

DETAILED DESCRIPTION OF THE PREFERRED EMBODIMENT

Figure 1:
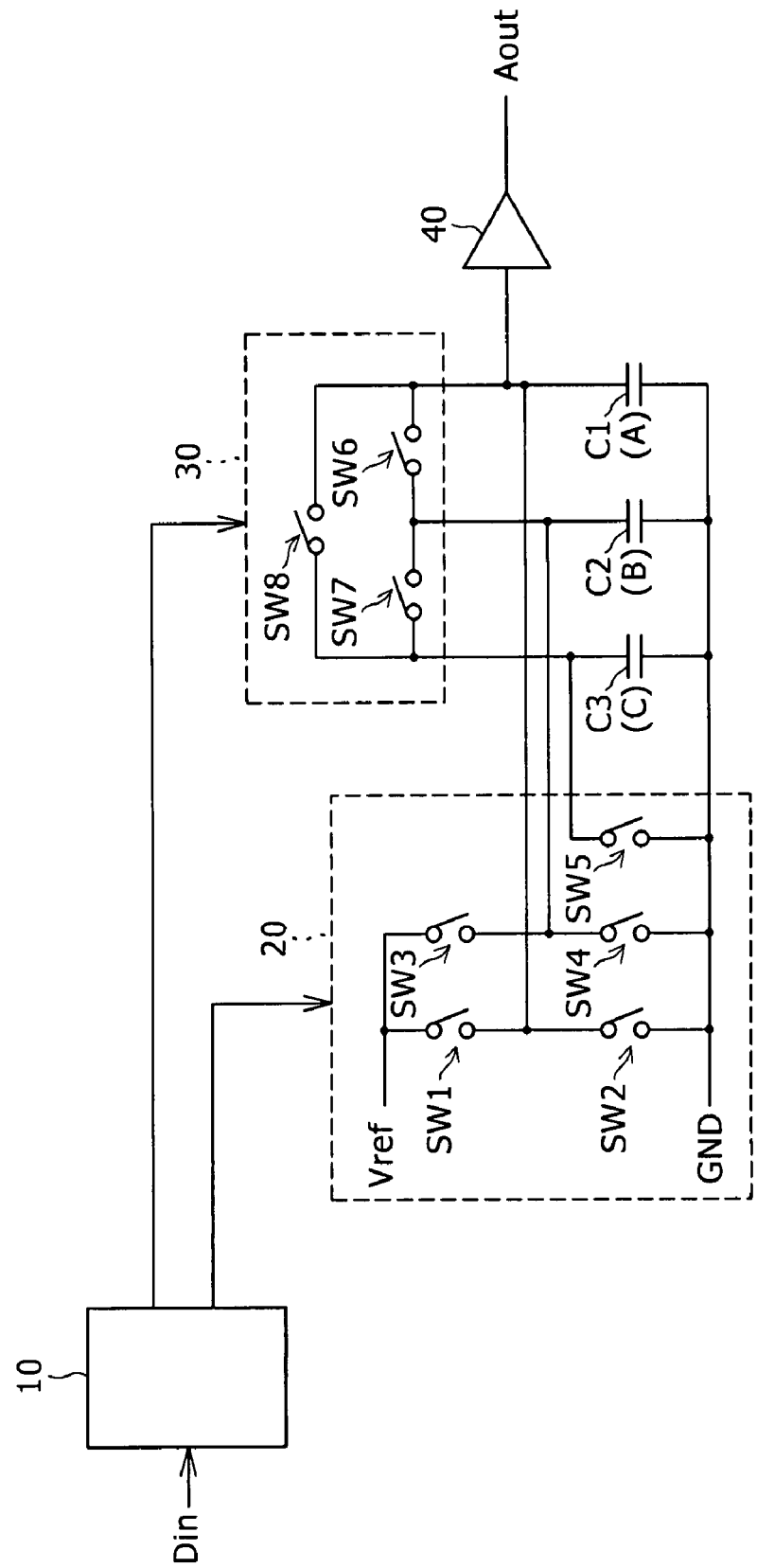
FIG. 1 is a circuit diagram showing an example of a configuration of a digital/analog conversion circuit to which the present invention is applied.

Referring to FIG. 1, there is shown an example of a configuration of a digital/analog conversion circuit to which the present invention is applied.

Before the digital/analog conversion circuit shown in FIG. 1 is described, description is given of a characteristic of an error which occurs with a general cyclic DAC, an outline of a method of reducing the error and a flow diagram useful to understanding of an operation of the cyclic DAC. It is to be noted that, while the following description is given particularly of a cyclic DAC of 11 bits as an example, the present invention can be applied to a cyclic DAC of any bit number and does not rely upon the number of bits.

Figure 13:
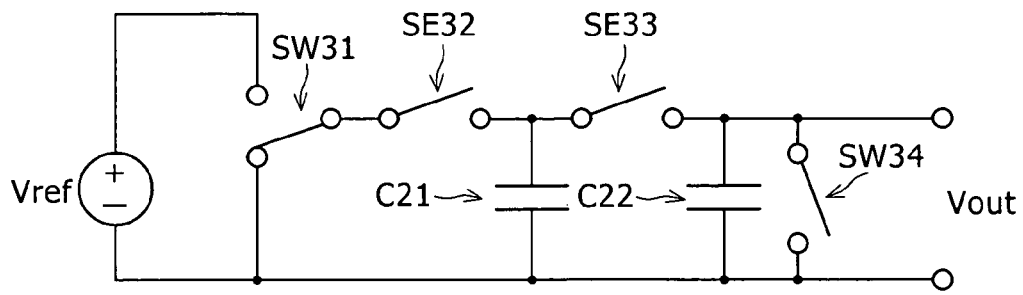
FIG. 13 is a circuit diagram showing an example of a configuration of a general cyclic DAC.
Figure 14:
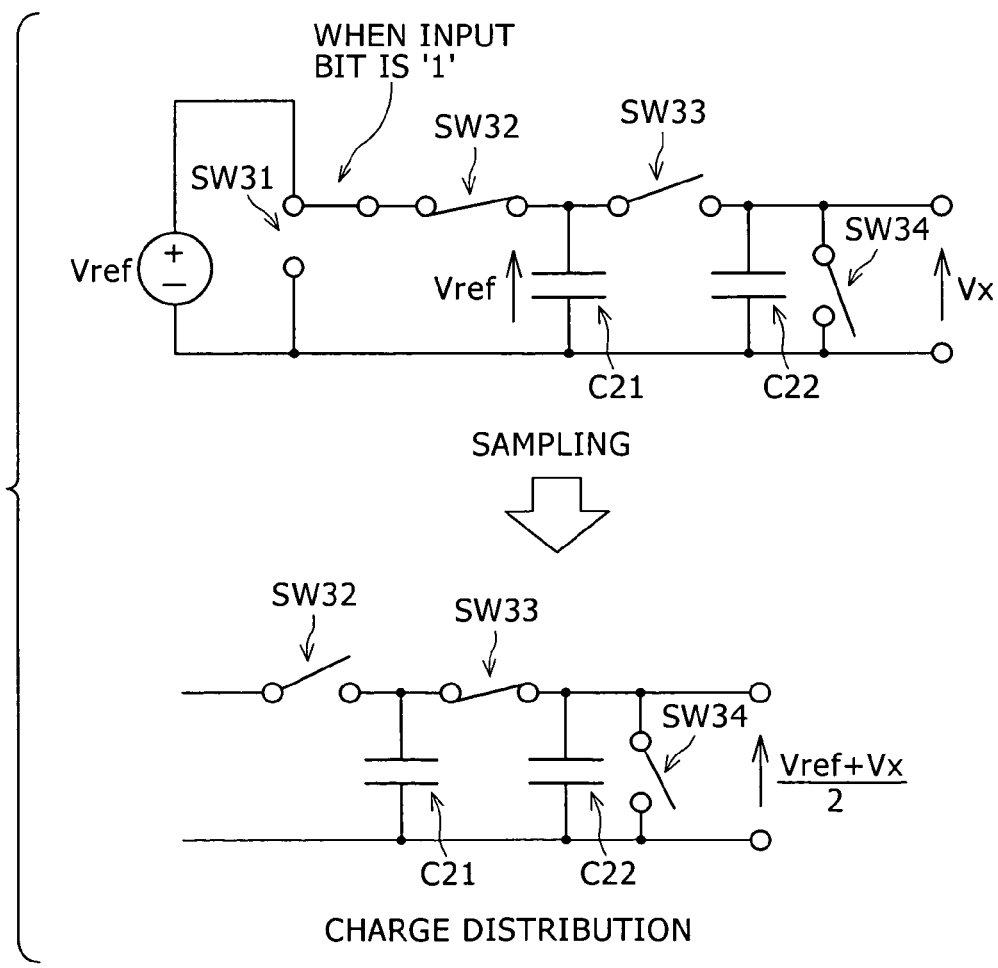
FIG. 14 is a circuit diagram illustrating sampling and charge sharing operations of the cyclic DAC of FIG. 13.
Figure 15:
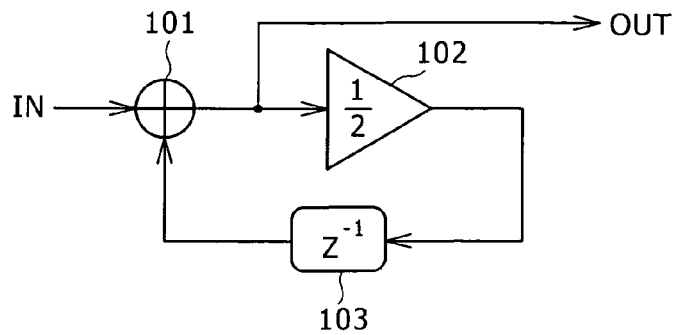
FIG. 15 is a circuit diagram showing a feedback system equivalent to the cyclic DAC of FIG. 13.

First, an error characteristic of a basic cyclic DAC shown in FIG. 13 is studied. In order to recognize the characteristic, an error transfer function (hereinafter referred to in abbreviation as ETF) E(k) is defined as given by the following expression (5):

$$E(k) \equiv \frac{\partial \Delta V_{out}}{\partial D_k} = \frac{(1+x)^{L-k}}{(2+x)^{L-k+1}} - \frac{1}{2^{L-k+1}} \quad (5)$$

It is to be noted that, in the expression (5) above, it is assumed that "$V_{ref}=1$" for the simplified description. As can be recognized from the definition of expression (5), the ETF represents by what degree each bit contributes to the output error.

Figure 2:
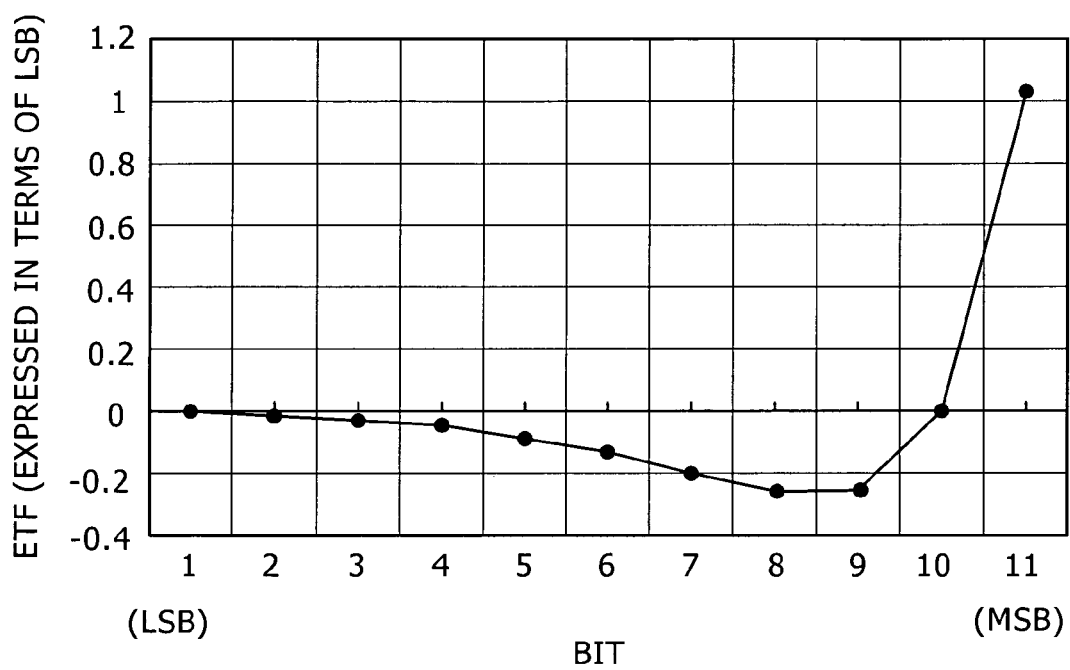
FIG. 2 is a graph illustrating an error transfer function of a basic cyclic DAC of 11 bits.

FIG. 2 illustrates the ETF of the basic cyclic DAC of 11 bits where the mismatch x in electrostatic capacitance is 0.2%. The axis of abscissa indicates the bit from the first bit (LSB) to the 11th bit (MSB), and the axis of ordinate indicates the value of the ETF normalized with the voltage value ($V_{ref}/2^{11}$) of 1 LSB.

Figure 16:
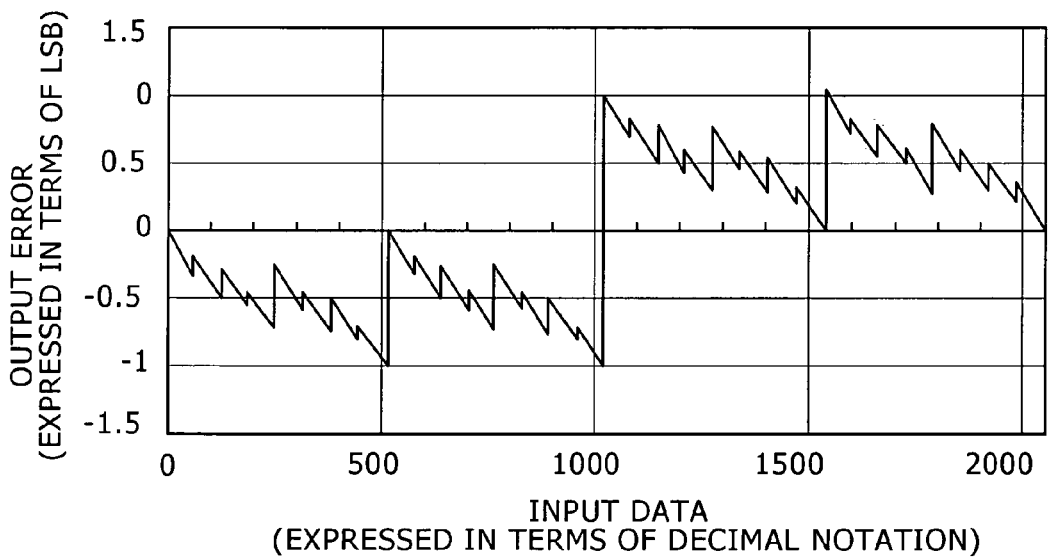
FIG. 16 is a diagram illustrating a relationship between an output error and input data of the cyclic DAC of FIG. 13.
Figure 17:
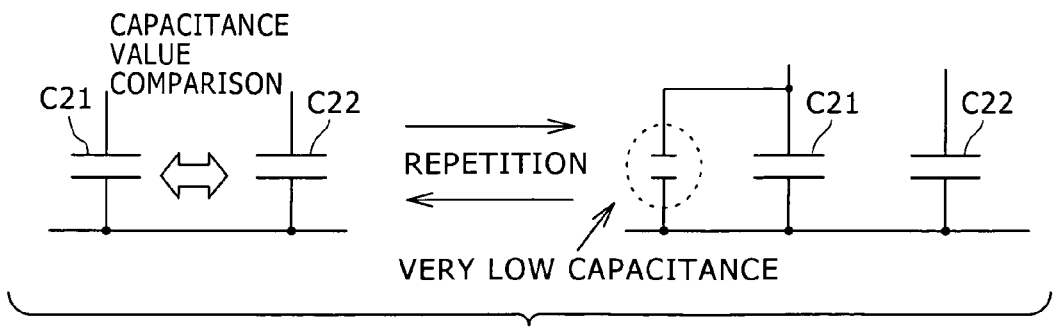
FIG. 17 is a circuit diagram illustrating correction of the electrostatic capacitance in an existing cyclic DAC.
Figure 18:
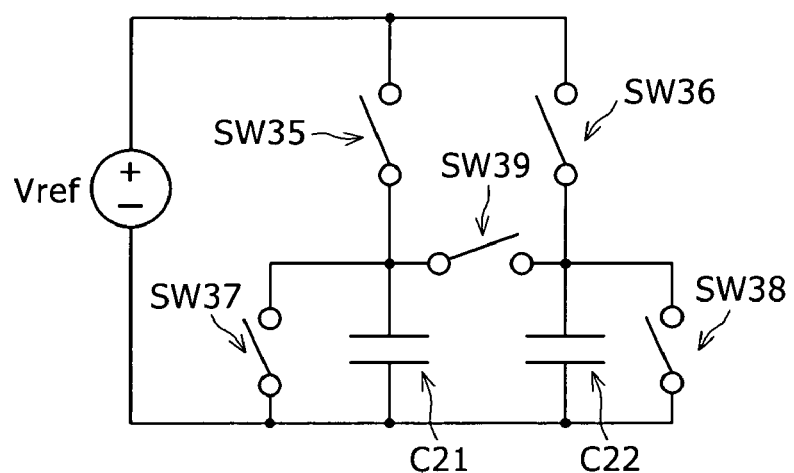
FIG. 18 is a circuit diagram showing an existing cyclic DAC to which a compensative switching technique is applied to perform conversion.

The ETF is very effective to understanding of the error characteristic of the cyclic DAC. For example, where all of the 11 bits are "1" (that is, "2048" in decimal notation), the output error in the graph shown in FIG. 16 is almost "0". This arises from the fact that errors appearing at the bits cancel one another, that is, the following expression (6) is satisfied:

$$\sum_{k=1}^{11} E(k) \equiv 0 \quad (6)$$

As another example, when all of the bits other than the MSB in the graph shown in FIG. 16 are "1" (that is, "1024" in decimal notation), the output error is approximately −1 LSB. However, when only the MSB is "1", the output error is approximately +1 LSB. This arises from the fact that the following expression (7) is satisfied:

$$-\sum_{k=1}^{10} E(k) \cong E(11) \cong 1 \; LSB \quad (7)$$

In this manner, when the error characteristic of the cyclic DAC is studied, the ETF is essential. In the following, description is given taking notice of the ETF.

Now, a relationship between the ETF and the ENOB is described. The ENOB relies upon a maximum value of the output error. Where this is described in relation to the ETF, the ENOB relies upon the maximum value in arbitrary addition of the ETF. In particular, even if the ETFs of almost all bits are "0", if the ETF of even one of the bits assumes a high value, the ENOB is restricted by the same. Further, even if the ETF values of the bits are low, if the sum value of them is high, then the ENOB is restricted by the sum value. In summary, in order to increase the ENOB, the error transfer function E(k) must exhibit a value as low as possible with respect to any bit k.

Here, a method of minimizing the error transfer function E(k) with respect to an arbitrary bit k is described. First, notice is taken of the fact that the ETF of the second MSB has a value very close to zero in the basic cyclic DAC. In other words, the ETF of the tenth bit in the cyclic DAC is almost zero as seen in FIG. 2 and is given by the following expression (8):

$$E(10) \equiv 0 \quad (8)$$

Thus, the ETF values of the 11th to 8th bits are represented, using the capacitance mismatch x, as given by the following expressions (9-1) to (9-4), respectively.

$$E(11) = \frac{1}{2+x} - \frac{1}{2} \cong -\frac{x}{4} \quad (9\text{-}1)$$

$$E(10) = \frac{1+x}{(2+x)^2} - \frac{1}{2^2} \cong -\frac{x^2}{16} \quad (9\text{-}2)$$

$$E(9) \cong \frac{x}{16} \quad (9\text{-}3)$$

$$E(8) \cong \frac{x}{16} \quad (9\text{-}4)$$

Where the expressions (9-1) to (9-4) are compared with each other, it can be recognized that, while the ETFs of the 8th, 9th and 11th bits include a first order term of the capacitance mismatch x, the ETF of the 10th bit does not include a first order term and can be approximated by a second order term. In other words, only the 10th bit ETF "E(10)" has a very small amount of a higher order than the other ETFs. Thus, a reason why this arises is studied.

FIGS. 3A to 3D illustrate a process followed by charge supplied to the capacitor C21 by sampling of the 10th bit.

Figure 3:
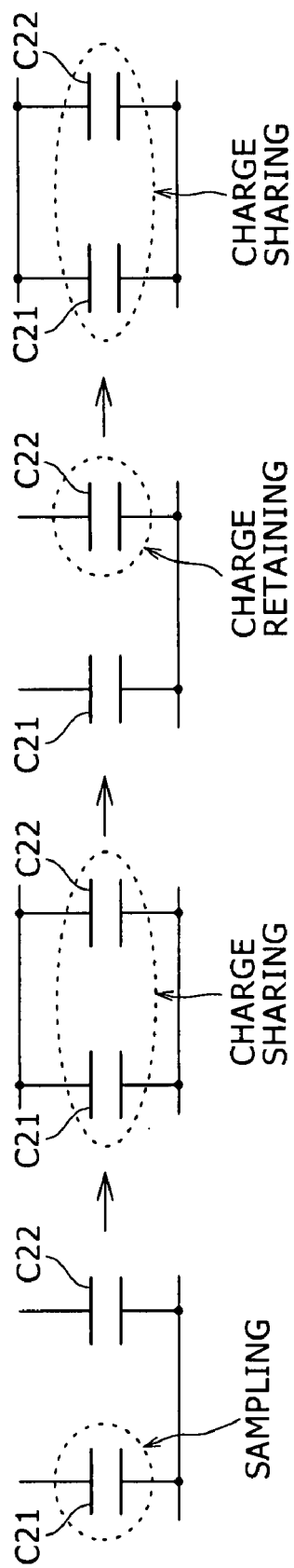
FIGS. 3A to 3D are circuit diagrams illustrating a procedure followed by charge supplied to capacitors in the basic cyclic DAC by a sampling operation of the second MSB, that is, the 10th bit.

Charge (FIG. 3A) supplied to the capacitor C21 by sampling of the 10th bit is shared to the capacitors C21 and C22 by charge sharing (FIG. 3B). The charge shared to the capacitor C22 by the charge sharing is retained by the capacitor C22 for a period of time within which sampling of the 11th bit is performed (FIG. 3C). When charge sharing is performed thereafter, the charge retained in the capacitor C22 is further shared to the capacitors C21 and C22 (FIG. 3D).

It is considered that the retention of charge in FIG. 3C is equivalent to sampling of the charge shared in FIG. 3B by the capacitor C21. Accordingly, from the process illustrated in FIGS. 3A to 3D, the error transfer function E(10) is represented by the following expression (10):

$$E(10) = \frac{A}{A+B} \cdot \frac{B}{A+B} - \frac{1}{2^2} \tag{10}$$

where "A" and "B" represent the electrostatic capacitances of the capacitors C21 and C22, respectively.

In the first term of the error transfer function E(10) represented by the expression (10), the relationship in magnitude between "A/(A+B)" and "½" is normally opposite to the relationship in magnitude between "B/(A+B)" and "½". In particular, where the "A/(A+B)" is higher than ½, "B/(A+B)" is lower than ½, but conversely where the "A/(A+B)" is lower than ½, "B/(A+B)" is higher than ½.

Accordingly, the first term "{A/(A+B)×{B/(A+B)}" in the expression (10) cancels the effect of the mismatch between the electrostatic capacitances A and B and gradually approaches "½²", and the ETF exhibits a very small amount of the second order.

In order to make it possible to apply this also to the other bits, it can be generalized in the following manner. In particular, the denominator and the numerator of (the first term of) the ETF are represented by cyclic polynomials in which the same electrostatic capacitances are used. This is hereinafter referred to as "cyclic rational expression" or "CRE".

In particular, the cyclic rational expression CRE of the bits is determined. First, since, in an existing cyclic DAC, sampling and charge sharing of the MSB are performed once, a CRE may not be constructed immediately. Therefore, a cyclic DAC which generates such an output voltage $V_{out}$ as represented by the expression (11) given below in place of the expression (1) is considered. In other words, a cyclic DAC whose output reference voltage is one half the input reference voltage $V_{ref}$ is considered.

$$V_{out} = V_{ref} \cdot \sum_{k=1}^{L} \frac{D_k}{2^{L-k-2}} = \frac{V_{ref}}{2} \cdot \sum_{k=1}^{L} \frac{D_k}{2^{L-k+1}} \tag{11}$$

In this instance, since charge sharing is performed twice in sampling of the MSB, the EFT can be represented using the CRE of the following expression described hereinabove:

$$\frac{AB}{(A+B)^2} \tag{12}$$

On the other hand, since, in sampling of the second MSB, charge sharing is performed three times, the CRE may not be constructed with two capacitors, but three capacitors may be required. Where three capacitors are used to perform charge sharing three times, the ETF can be represented using the CRE represented by the following expression (13):

$$\frac{ABC}{(A+B)(B+C)(C+A)} \tag{13}$$

Here, by defining the electrostatic capacitances B and C as "B=A×(1+x)" and "C=A×(1+y)", respectively, and substituting them into the expression (13), the ETF is represented by the following expression (14):

$$\frac{ABC}{(A+B)(B+C)(C+A)} - \frac{1}{2^3} \cong \frac{-(x+y)^2 + 3xy}{32} \tag{14}$$

As can be recognized from the expression (14), the ETF represented using the CRE surely exhibits a very small amount of the second order regarding the capacitance mismatches x and y.

The ETF of a bit with regard to which charge sharing is performed by an even number of times for a sampling result such as the third MSB or the fifth MSB can be represented using the CRE of the expression (15) given below by repetitively utilizing the CRE of the MSB indicated by the expression (12):

$$\frac{A^n B^n}{(A+B)^{2n}} \tag{15}$$

On the other hand, the ETF of a bit with regard to which charge sharing is performed by an odd number of times for a sampling result such as the fourth MSB or the sixth MSB can be represented using the CRE of the expression (16) given below which is a combination of the CRE indicated by the expression (13) and the CRE of the CRE indicated by the expression (14). In the expression (16), each of "k", "l", "m" and "n" represents zero or a positive integer.

$$\frac{A^k B^k C^k}{(A+B)^k(B+C)^k(C+A)^k} \cdot \frac{A^l B^l}{(A+B)^{2l}} \cdot \frac{B^m C^m}{(B+C)^{2m}} \cdot \frac{C^n A^n}{(C+A)^{2n}} \tag{16}$$

Generally, since reduction of the number of capacitors is preferable in terms of reduction of the area, three (the minimum number with which the CRE can be implemented) capacitors are used to configure the CRE in the expression (16). However, the number of capacitors is not limited to this, but the CRE can be configured using four or more capacitors. For example, if five capacitors are used, then in addition to such a CRE as represented by the expression (16), a CRE wherein the CRE represented by the expression (16) is multiplied by such an item as represented by the following expression (17) can be configured. In the expression (17), "k" is zero or a positive integer.

$$\frac{A^k B^k C^k D^k E^k}{(A+B)^k(B+C)^k(C+D)^k(D+E)^k(E+A)^k} \tag{17}$$

Now, a relationship between the denominator and the numerator of the CRE is described.

The denominator of the CRE given above is represented by the product of one or a plurality of cyclic polynomials. Further, each of the cyclic polynomials is represented by multiplication of a plurality of sums of two electrostatic capacitances involved in charge sharing.

For example, the cyclic polynomial formed from two electrostatic capacitances A and B is "(A+B)×(B+A)", the cyclic polynomial formed from three electrostatic capacitances A, B and C is "(A+B)×(B+C)×(C+A)", and the cyclic polynomial formed from four electrostatic capacitances A, B, C and D is "(A+B)×(B+C)×(C+D)×(D+A)". Further, the cyclic polynomial formed from five electrostatic capacitances A, B, C, D and E is "(A+B)×(B+C)×(C+D)×(D+E)×(E+A)".

As can been recognized from the examples, the cyclic polynomial formed from P (which is an integer greater than 1) electrostatic capacitances is the product of the sum of P pairs of electrostatic capacitances selected from among P electrostatic capacitances. Further, the entire P pairs (2×P electrostatic capacitances) include two electrostatic capacitances for each of the P electrostatic capacitances.

Meanwhile, the numerator of the CRE given hereinabove is represented by the product of the electrostatic capacitances which form the cyclic polynomial of the denominator. In particular, where the denominator is represented by one cyclic polynomial, the numerator is represented by the product of the electrostatic capacitances which form the cyclic polynomial. On the other hand, where the denominator is represented by the product of a plurality of cyclic polynomials, the numerator is represented by the product of the products of the electrostatic capacitances which form the individual cyclic polynomials.

For example, where the denominator is represented by one cyclic polynomial "(A+B)×(B+C)×(C+D)×(D+E)×(E+A)", the numerator is represented by the product "A·B·C·D·E" of the five electrostatic capacitance A, B, C, D and E. Meanwhile, where the denominator is represented by two cyclic polynomials "(A+B)×(B+A)" and "(A+B)×(B+C)×(C+A)", the numerator is represented by the product "(A·B)×(A·B·C) =$A^2 \cdot B^2 \cdot C$" of the products of the electrostatic capacitances which form the individual cyclic polynomials.

From the foregoing, where the numerator of the CRE is represented by the product of P electrostatic capacitances (P electrostatic capacitances may include a plurality of equal electrostatic capacitances), the denominator is the sum of P pairs of electrostatic capacitances selected from among the P electrostatic capacitances which form the numerator (P pairs of electrostatic capacitances may include a pair of the same combination). It is to be noted that the entire P pairs of the denominator (2×P electrostatic capacitances) include two electrostatic capacitances for each of the P electrostatic capacitances.

For example, where the numerator is represented by the product "$A^2 \cdot B^2$" of the electrostatic capacitances A, A, B and B, the denominator is the product of four products of the sums of pairs of the electrostatic capacitances and besides the entire pairs include two electrostatic capacitances for each of the electrostatic capacitances A, A, B and B. The denominator of the CRE which satisfies the condition just described is the product "$(A+B)^4$" of the cyclic polynomials "$(A+B)^2$" and "$(A+B)^2$".

Meanwhile, where the numerator is represented by the product "$A \cdot B \cdot C^2 \cdot D$" of the electrostatic capacitances A, B, C, C and D, the denominator is the product of five products of the sums of pairs of the electrostatic capacitances and besides the entire pairs include two electrostatic capacitances for each of the P electrostatic capacitances A, B, C, C and D. The denominator of the CRE which satisfies the condition just described is the product "(A+B)×(B+C)×(C+A)×(C+D)²" of the two cyclic polynomials "(A+B)×(B+C)×(C+A)" and "(C+D)×(D+C)".

Incidentally, the sum of each of the pairs of electrostatic capacitances which form the denominator of the CRE indicates the static capacitance of a pair of capacitors which relate to a charge sharing operation (FIGS. 3B and 3D). Meanwhile, each of the electrostatic capacitances which form the numerator of the CRE indicates the electrostatic capacitance of a capacitor which relates to a sampling operation (FIG. 3A) or a charge retaining operation (FIG. 3C).

Accordingly, the relationship between the numerator and the denominator of the CRE described above can be paraphrased in the following manner.

In particular, when charge corresponding to the value of a certain bit is supplied to a capacitor (sampling operation) and the charge generates (part of) an output voltage through a plural number of times of sharing operations, if the number of times by which one capacitor takes part in the charge sharing operation within the series of operations (that is, the number of times by which one capacitor is included in the denominator) is set to twice the number of times by which the capacitor takes part in the sampling operation or the charge retaining operation (that is, the number of times by which the capacitor is included in the numerator), the ETF of the bit can be represented by the CRE.

An outline of the technique of reducing the output error caused by a mismatch between electrostatic capacitances is such as described above.

Now, a digital/analog conversion circuit to which the technique described above is applied to achieve reduction of the output error is described.

First, a flow diagram technique for representing sampling and charge sharing operations of the cyclic digital/analog conversion circuit is introduced. As an example, a flow diagram of the basic cyclic DAC shown in FIG. 13 is shown in FIG. 4.

Figure 4:
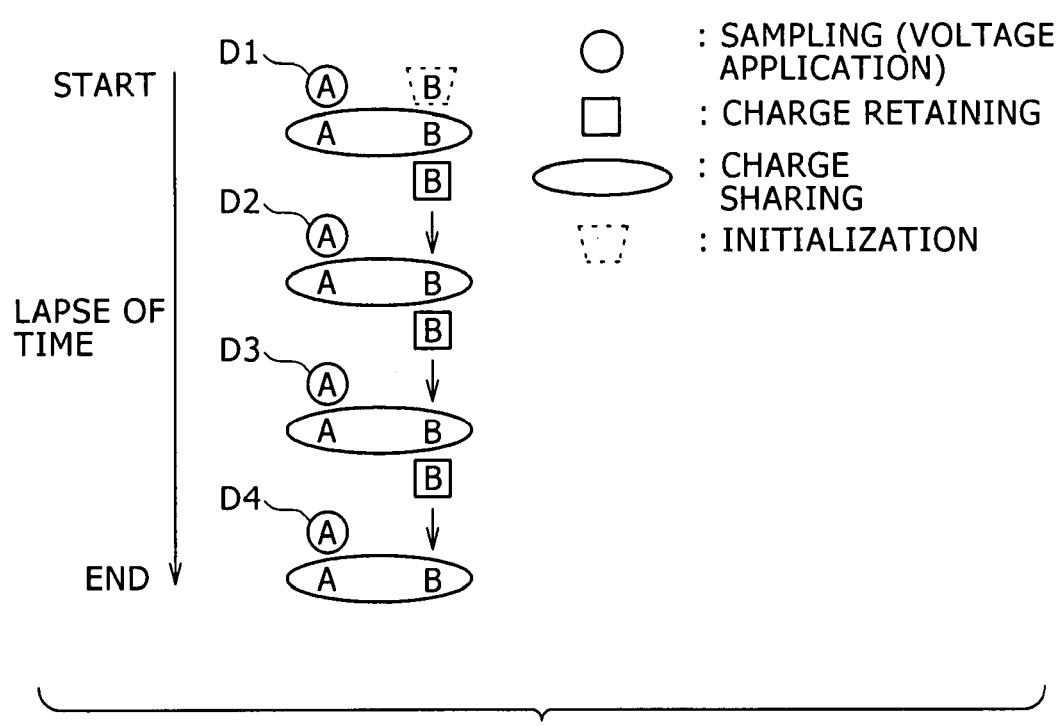
FIG. 4 is a flow diagram illustrating an operation sequence of the basic cyclic DAC.

Referring to FIG. 4, the flow diagram shown represents in what order predetermined operations are performed for individual capacitors. The operation sequence represented by the flow diagram particularly includes four basic operations, that is, a sampling operation (voltage application operation), a charge retaining operation, a charge sharing operation and a charge resetting operation (initialization operation). Further, if arrow marks are traced from a start point given by the sampling operation, then it can be recognized readily what processes are successively performed for each input bit.

For example, in the flow diagram shown in FIG. 4, a voltage corresponding to a value of the first bit D1 (LSB) is applied to a capacitor of an electric capacitance A (sampling operation) and charge of another capacitor having an electrostatic capacitance B is reset (initialization operation). Thereafter, the capacitors of the electrostatic capacitances A and B are connected in parallel to each other once (charge sharing operation). Then, the two capacitors connected in parallel are disconnected from each other, and charge is retained in the capacitor of the electrostatic capacitance B (charge retaining operation). Then, a voltage corresponding to the value of the second bit D2 is applied to the capacitor of the electrostatic capacitance A (sampling operation), and the capacitors of the electrostatic capacitances A and B are connected in parallel again (charge sharing operation). Then, the two capacitors are disconnected from each other again and charge is retained in the capacitor of the electrostatic capacitance B (charge retaining operation). Thereafter, similar operations are repeated with regard to the third bit D3 and the fourth bit D4.

Where the flow diagram is used, even if the number of capacitors increases, the process of the cyclic digital/analog conversion circuit can be described clearly.

Further, (the first term of) the ETF of each bit can be calculated readily if the flow diagram is used. The calculation method can be settled in the following manner.

(1) In the sampling operation, the electrostatic capacitance of a capacitor to be used for sampling is multiplied.

(2) In the charge sharing operation, the charge is divided by the sum of the characteristic capacitances of the capacitors connected in parallel.

(3) In the charge retaining operation after the charge sharing operation, the charge is multiplied by the electrostatic capacitance of the capacitor to be used to retain the charge.

For example, in the flow diagram of FIG. 4, charge supplied by the sampling operation of the third bit (second MSB) is processed through a procedure of:

"A" (sampling);
"A+B" (charge sharing);
"B" (charge retaining); and
"A+B" (charge sharing).

Therefore, if the calculation method described above is applied to this procedure, then $$A \times \{1/(A+B)\} \times B \times \{1/(A+B)\}$$

is obtained. This coincides with the first term of the ETF of the second MSB in the expression (10) given hereinabove.

In what manner the flow diagram should be viewed is described above. However, conversely speaking, also it is possible to freely construct an operation sequence which can be implemented by using the flow diagram. If the operation sequence is determined, then the configuration of a digital/analog conversion circuit can be determined.

Now, a digital/analog conversion circuit shown in FIG. 1 is described as an embodiment of the present invention which satisfies the condition of the cyclic rational expression given hereinabove.

Referring to FIG. 1, the digital/analog conversion circuit includes capacitors C1, C2 and C3, a control circuit 10, a voltage application circuit 20, a connection circuit 30, and a buffer amplifier 40.

The capacitors C1, C2 and C3 serve as capacitors in the present invention.

The voltage application circuit 20 serves as a voltage application section.

The connection circuit 30 serves as a connection section.

The control circuit 10 serves as a control section.

The capacitors C1, C2 and C3 have electrostatic capacitances A, B and C, respectively. The electrostatic capacitances A, B and C have values substantially equal to each other.

The voltage application circuit 20 applies a reference voltage $V_{ref}$ or the zero voltage to each of the capacitors C1, C2 and C3 under the control of the control circuit 10.

The voltage application circuit 20 shown in FIG. 1 includes switches SW1 to SW5 each formed from a switch element such as, for example, a MOS transistor.

The capacitors C1, C2 and C3 are connected at one of terminals thereof to one of terminals of the switches SW2, SW4 and SW5, respectively. The switches SW1 and SW3 are connected at one of terminals thereof commonly to the reference voltage $V_{ref}$. The switch SW2 is connected in parallel to the capacitor C1 and connected in series to the switch SW1.

The switch SW4 is connected in parallel to the capacitor C2 and connected in series to the switch SW3. The switch SW5 is connected in parallel to the capacitor C3.

If the switch SW1 is set to an on state and the switch SW2 is set to an off state by the control circuit 10, then the reference voltage $V_{ref}$ is applied to the capacitor C1. On the contrary, if the switch SW1 is set to an off state and the switch SW2 is set to an on state, then the zero voltage is applied to the capacitor C1, or in other words, the opposite terminals of the capacitor C1 are short-circuited. If both of the switches SW1 and SW2 are set to an off state, then application of a voltage to the capacitor C1 is stopped.

If the switch SW3 is set to an on state and the switch SW4 is set to an off state by the control circuit 10, then the reference voltage $V_{ref}$ is applied to the capacitor C2. On the contrary, if the switch SW3 is set to an off state and the switch SW4 is set to an on state, then the zero voltage is applied to the capacitor C2 (in other words, the opposite terminals of the capacitor C2 are short-circuited). If both of the switches SW3 and SW4 are set to an off state, then application of a voltage to the capacitor C2 is stopped.

If the switch SW5 is set to an on state by the control circuit 10, then the zero voltage is applied to the capacitor C3 (in other words, the opposite terminals of the capacitor C3 are short-circuited). If the switch SW5 is set to an off state, then application of a voltage to the capacitor C3 is stopped.

The connection circuit 30 selects a capacitor pair from among the capacitors C1, C2 and C3 and connects the selected capacitors in parallel under the control of the control circuit 10.

The connection circuit 30 in FIG. 1 includes switches SW6, SW7 and SW8 each formed from a switch element such as, for example, a MOS transistor.

The switches SW6, SW7 and SW8 are connected between those terminals of the capacitors C1, C2 and C3 (which are not connected to the ground GND). In particular, the switch SW6 is connected between the terminals of the capacitors C1 and C2; the switch SW7 is connected between the terminals of the capacitors C2 and C3; and the switch SW8 is connected between the terminals of the capacitors C3 and C1.

If the switch SW6 is set to an on state and the switches SW7 and SW8 are set to an off state by the control circuit 10, then the capacitors C1 and C2 are connected in parallel. If the switch SW7 is set to an on state and the switches SW6 and SW8 are set to an off state, then the capacitors C2 and C3 are connected in parallel. If the switch SW8 is set to an on state and the switches SW6 and SW7 are set to an off state, then the capacitors C3 and C1 are connected in parallel.

The buffer amplifier 40 generates signal Aout corresponding to a voltage generated in the capacitor C1 and outputs the signal Aout as a digital/analog conversion result.

The control circuit 10 controls the voltage application circuit 20 and the connection circuit 30 in accordance with a predetermined operation sequence to generate a voltage corresponding to a binary code Din of a bit length L (L is an integer equal to or higher than three) across the capacitor C1.

The operation sequence of the control circuit 10 includes four operations including a sampling operation (voltage application operation), a charge sharing operation, a charge retaining operation and a charge resetting operation (initialization operation) as described hereinabove.

In the sampling operation, the control circuit 10 controls the voltage application circuit 20 to apply the reference voltage $V_{ref}$ or the zero voltage to the capacitor C1 or C2 in response to the value of the Kth bit of the binary code Din (K is an integer equal to or higher than one, and the first bit is the least significant bit of the binary code Din). By the voltage application, charge corresponding to the value of the Kth bit is applied to the capacitor C1 or C2. The charge supplied to the capacitor C1 or C2 by the sampling operation is hereinafter referred to as sample charge.

In the charge sharing operation, the control circuit 10 controls the connection circuit 30 so as to connect two capacitors selected from among the capacitors C1, C2 and C3 in parallel. By the parallel connection of the two capacitors, charge accumulated in each of the two capacitors is shared to the two capacitors.

In the charge retaining operation, the control circuit 10 controls the connection circuit 30 to disconnect the two parallel connected capacitors and retain the charge accumulated in one of the two capacitors.

In the charge resetting operation, the voltage of the capacitor C1, C2 or C3 is initialized to the zero voltage (that is, the opposite terminals of the capacitor C1, C2 or C3 are short-circuited).

The control circuit 10 performs a charge sharing operation by (L−K+N) times (N is an integer equal to or higher than two) for sample charge of the Kth bit of the binary code Din and collects the sample charge of the bits of the binary code Din into a common capacitor before the last charge sharing operation of the operation sequence.

In particular, when the operation sequence is completed, the sample charge of each bit is collected to the common capacitor through a predetermined number of times of charge sharing operations. At this time, the number of times by which the charge sharing operation is performed for sample charge increases toward the least significant bit. In particular, as the bit number decreases by one bit toward the least significant bit, the number of times of a charge sharing operation increases once. Since charge is multiplied by approximately ½ by one charge sharing operation, the weight coefficient by which the sample charge is multiplied decreases to ½ time for each difference in bit number by one bit toward the least significant bit.

Accordingly, the sample charge of each bit collected into the common capacitor upon completion of the operation sequence is multiplied by a weight coefficient of a factor of an "exponentiation of ½" for the bit. As a result, a voltage corresponding to the value of the binary code Din is generated in the common capacitor.

Further, the control circuit 10 sets the number of times by which one capacitor takes part in a charge sharing operation within a series of operations until a sample charge of the bits is shared in the last charge sharing operation to twice the number of times by which the capacitor takes part in a sampling operation or a charge retaining operation.

For example, where the capacitor C1 is used once for a sampling operation and once for a charge retaining operation for a sample charge of a certain bit (that is, used totally twice), the capacitor C1 is used four times for a charge sharing operation of the sample charge.

Where the operation sequence is configured so as to satisfy such conditions as described above, (the first term of) the ETF of each bit is represented by a cyclic rational expression and is a very small amount of a high order with regard to a mismatch among the electrostatic capacitances A, B and C.

Now, the operation sequence of the digital/analog conversion circuit shown in FIG. 1 is described with reference to FIGS. 5 and 6.

Figure 5:
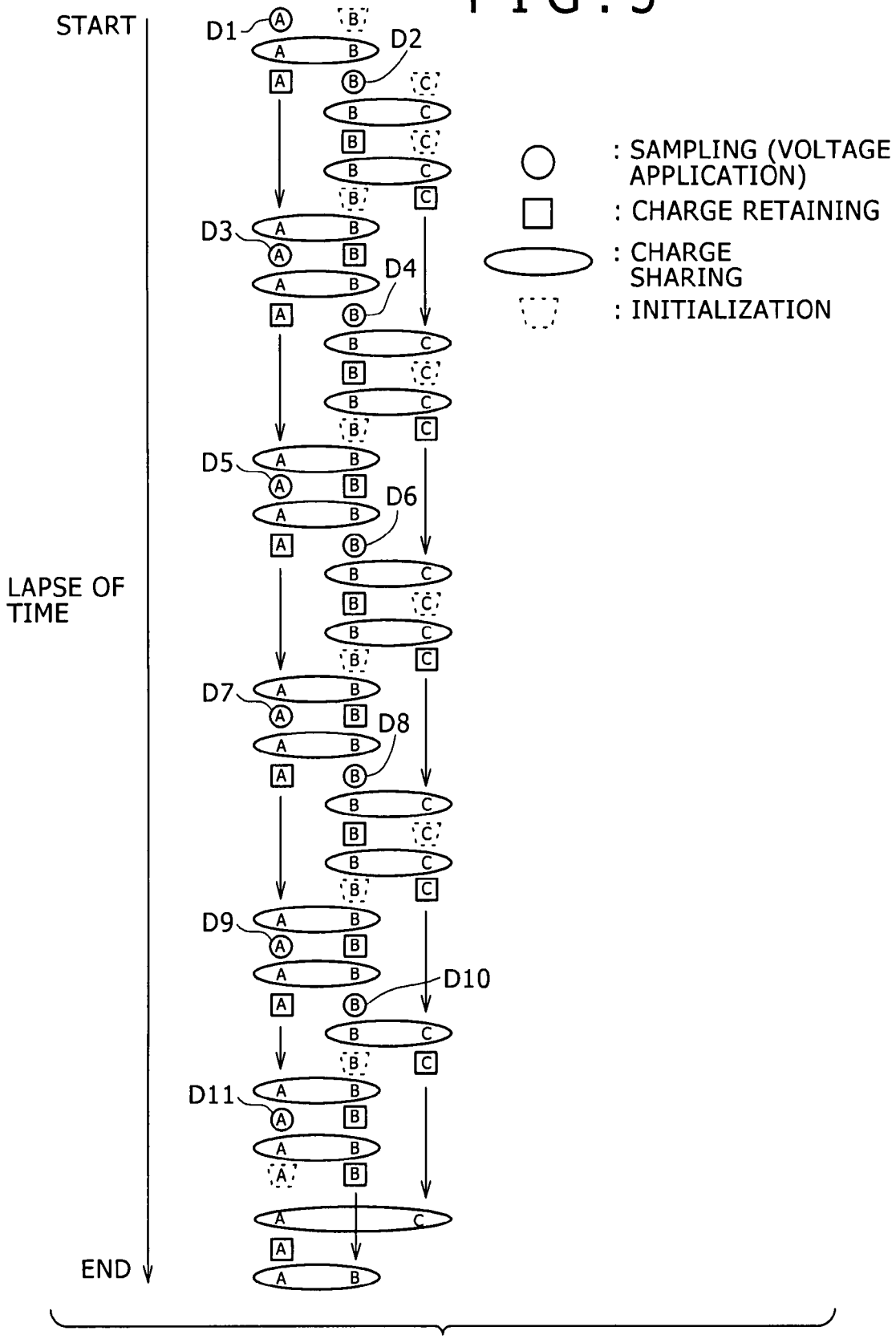
FIG. 5 is a flow diagram illustrating an example of an operation sequence of the digital/analog circuit of FIG. 1.

FIG. 5 illustrates an example of the operation sequence of the digital/analog conversion circuit where the bit number L of the binary code Din is "11".

In the operation sequence illustrated in FIG. 5, sample charge of the odd-numbered bits (D1, D3, . . . , D9, D11) and sample charge of the even-numbered bits (D2, D4, . . . , D8, D10) are processed by sequences independent of each other. Then, the sample charge processed by the individual sequences is collected into the common capacitor (C1, C2) by the last charge sharing operation.

Figure 6:
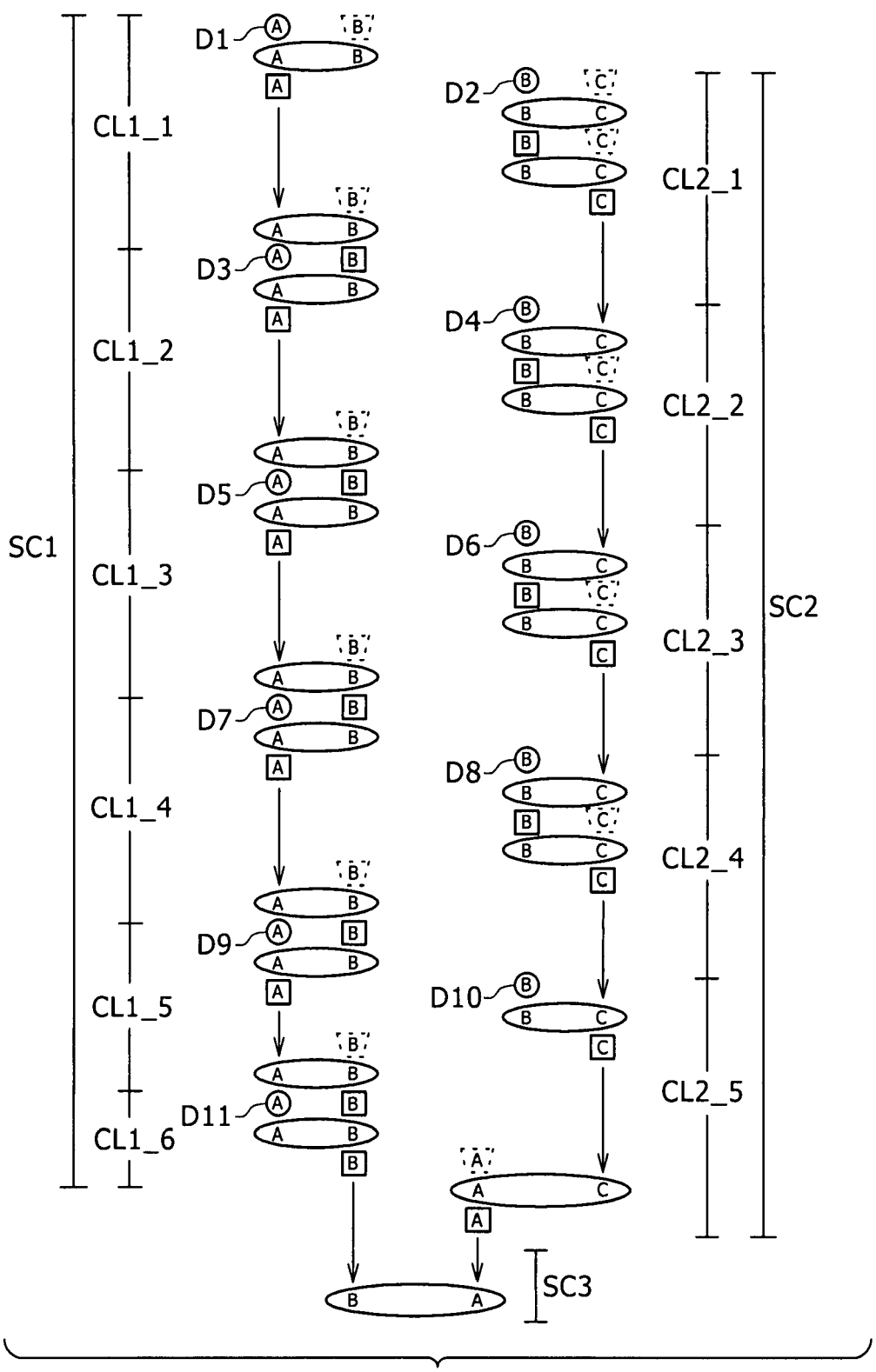
FIG. 6 is a flow diagram illustrating the operation sequence of FIG. 5 divisionally as three sequences.

FIG. 6 illustrates the independent sequences separately from the operation sequence illustrated in FIG. 5.

The operation sequence illustrated in FIG. 6 includes three sequences SC1, SC2 and SC3. In the first sequence SC1, sample charge of the odd-numbered bits D1, D3, . . . , D9, D11 is processed. In the second sequence SC2, sample charge of the even-numbered bits D2, D4, . . . , D8, D10 is processed. In the third sequence SC3, the sample charge processed by the sequences SC1 and SC2 is collected into the common capacitor (C1, C2). The sequences mentioned are described below individually.

As seen in FIG. 6, the first sequence SC1 includes operation cycles CL1_1 to CL1_6. In the operation cycles CL1_2 to CL1_5 among the operation cycles CL1_1 to CL1_6, the same process is repeated.

In the operation cycle CL1_1, the sampling operation of the first bit D1 (LSB) is performed, and a voltage corresponding to the value of the first bit D1 is applied to the capacitor C1 (electrostatic capacitance A). Concurrently with the sampling operation, charge resetting of the capacitor C2 (electrostatic capacitance B) is performed. Then, charge sharing is performed by parallel connection of the capacitors C1 and C2, and thereafter, charge retaining of the capacitor C1 and charge resetting of the capacitor C2 are performed. Thereafter, charge sharing is performed again by parallel connection of the capacitors C1 and C2, and charge retaining of the capacitor C2 is performed after the charge sharing.

In the operation cycles CL1_2, CL1_3, CL1_4 and CL1_5, the sampling operation of the third bit D3, fifth bit D5, seventh bit D7 and ninth bit D9 is performed. By each of the sampling operations, a voltage corresponding to the value of the pertaining bit is applied to the capacitor C1. Then, the capacitor C2 in which charge is retained at the last end of the preceding operation cycle and the capacitor C1 to which the voltage is applied by the sampling operation described above are connected in parallel to perform charge sharing between the capacitors C1 and C2. After the charge sharing, charge retaining of the capacitor C1 and charge resetting of the capacitor C2 are performed. Then, charge sharing is performed again by parallel connection of the capacitors C1 and C2, and charge retaining of the capacitor C2 is performed after the charge sharing.

In the operation cycle CL1_6, the sampling operation of the eleventh bit D11 (MSB) is performed, and a voltage corresponding to the value of the eleventh bit D11 is applied to the capacitor C1. Then, the capacitor C2 into which charge is retained at the last end of the operation cycle CL1_5 and the capacitor C1 to which the voltage is applied by the sampling operation described above are connected in parallel to perform charge sharing between the capacitors C1 and C2. After the charge sharing, charge retaining of the capacitor C2 is performed.

The second sequence SC2 includes operation cycles CL2_1 to CL2_5 as seen in FIG. 6. In the operation cycles CL2_2 to CL2_4 among the operation cycles CL2_1 to CL2_5, the same process is repeated.

In the operation cycle CL2_1, the sampling operation of the second bit D2 is performed, and a voltage corresponding to the value of the second bit D2 is applied to the capacitor C2 (electrostatic capacitance B). Concurrently with the sampling operation, charge resetting of the capacitor C3 (electrostatic capacitance C) is performed. Then, charge sharing is performed by parallel connection of the capacitors C2 and C3, and thereafter, charge retaining of the capacitor C2 and charge resetting of the capacitor C3 are performed. Thereafter, charge sharing is performed again by parallel connection of the capacitors C2 and C3, and charge retaining of the capacitor C3 is performed after the charge sharing.

In the operation cycles CL2_2, CL2_3 and CL2_4, the sampling operation of the fourth bit D4, sixth bit D6 and eighth bit D8 is performed. By each of the sampling operations, a voltage corresponding to the value of the pertaining bit is applied to the capacitor C2. Then, the capacitor C3 into which charge is retained at the last end of the preceding operation cycle and the capacitor C2 to which the voltage is applied by the sampling operation described above are connected in parallel to perform charge sharing between the capacitors C2 and C3. After the charge sharing, charge retaining of the capacitor C2 and charge resetting of the capacitor C3 are performed. Thereafter, charge sharing is performed by parallel connection of the capacitors C2 and C3. Then, after the charge sharing, charge retaining of the capacitor C3 is performed.

In the operation cycle CL2_5, the sampling operation of the tenth bit D10 is performed, and a voltage corresponding to the value of the tenth bit D10 is applied to the capacitor C2. Then, the capacitor C3 into which charge is retained at the last end of the operation cycle CL2_4 and the capacitor C2 to which the voltage is applied by the sampling operation described above are connected in parallel to perform charge sharing between the capacitors C2 and C3. After the charge sharing, charge retaining of the capacitor C3 and charge resetting of the capacitor C1 (electrostatic capacitance A) are performed. Thereafter, charge sharing is performed by parallel connection of the capacitors C1 and C3, and charge retaining of the capacitor C1 is performed after the charge sharing.

In the third sequence SC3, the capacitor C2 into which charge is retained at the last end of the first sequence SC1 and the capacitor C1 into which charge is retained at the last end of the second sequence SC2 are connected in parallel to perform charge sharing between the capacitors C2 and C1. Consequently, sample charge of the odd-numbered bits D1, D3, ..., D9, D11 processed in the first sequence SC1 and sample charge of the even-numbered bits D2, D4, ..., D8, D10 processed in the second sequence SC2 are collected into the common capacitor (C1, C2).

By the operation sequence described above with reference to FIGS. 5 and 6, the ETFs of the odd-numbered bits D1, D3, ..., D9, D11 are represented as given by the expressions (18-1) to (18-6), respectively:

$$E(11) = \frac{AB}{(A+B)(B+A)} - \frac{1}{2^2} \quad (18\text{-}1)$$

$$E(9) = \frac{(AB)^2}{\{(A+B)(B+A)\}^2} - \frac{1}{2^4} \quad (18\text{-}2)$$

$$E(7) = \frac{(AB)^3}{\{(A+B)(B+A)\}^3} - \frac{1}{2^6} \quad (18\text{-}3)$$

$$E(5) = \frac{(AB)^4}{\{(A+B)(B+A)\}^4} - \frac{1}{2^8} \quad (18\text{-}4)$$

$$E(3) = \frac{(AB)^5}{\{(A+B)(B+A)\}^5} - \frac{1}{2^{10}} \quad (18\text{-}5)$$

$$E(1) = \frac{(AB)^6}{\{(A+B)(B+A)\}^6} - \frac{1}{2^{12}} \quad (18\text{-}6)$$

Meanwhile, the ETFs of the even-numbered bits D2, D4, ..., D8, D10 are represented as given by the following expressions (19-1) to (19-5), respectively:

$$E(10) = \frac{ABC}{(A+B)(B+C)(C+A)} - \frac{1}{2^3} \quad (19\text{-}1)$$

$$E(8) = \frac{(ABC)(BC)}{\{(A+B)(B+C)(C+A)\}\{(B+C)(C+B)\}} - \frac{1}{2^5} \quad (19\text{-}2)$$

$$E(6) = \frac{(ABC)(BC)^2}{\{(A+B)(B+C)(C+A)\}\{(B+C)(C+B)\}^2} - \frac{1}{2^7} \quad (19\text{-}3)$$

$$E(4) = \frac{(ABC)(BC)^3}{\{(A+B)(B+C)(C+A)\}\{(B+C)(C+B)\}^3} - \frac{1}{2^9} \quad (19\text{-}4)$$

$$E(2) = \frac{(ABC)(BC)^4}{\{(A+B)(B+C)(C+A)\}\{(B+C)(C+B)\}^4} - \frac{1}{2^{11}} \quad (19\text{-}5)$$

As can be recognized from the expressions given above, with regard to all bits, the first term of the ETF is a cyclic rational expression. Therefore, even if a mismatch exists among the electrostatic capacitances A, B and C, the ETF exhibits a very small amount of a high order with regard to the mismatch.

As described above, according to the digital/analog conversion circuit of the present embodiment, the operation sequence is configured such that the ETF of each bit is represented by a cyclic rational expression. In particular, the control circuit 10 controls the voltage application circuit 20 and the connection circuit 30 such that, within the series of operations until sample charge of each bit is shared in the last charge sharing operation, the number of times by which one capacitor takes part in a charge sharing operation is twice the number of times by which the capacitor takes part in a sampling operation or a charge retaining operation.

Consequently, since the ETF of each bit can be set to a very small amount of a high order with regard to a mismatch in electrostatic capacitance, whatever value the binary code Din assumes, the output error caused by a mismatch in electrostatic capacitance can always be suppressed to a very low value. Accordingly, the output error originating from a mismatch in electrostatic capacitance can be improved drastically to achieve significant enhancement of the maximum effective bit number (ENOB).

Further, since the output error originating from a mismatch in electrostatic capacitance can be reduced without increasing the size of capacitors, reduction of the area and reduction of the power consumption of the circuit can be achieved.

Figure 7:
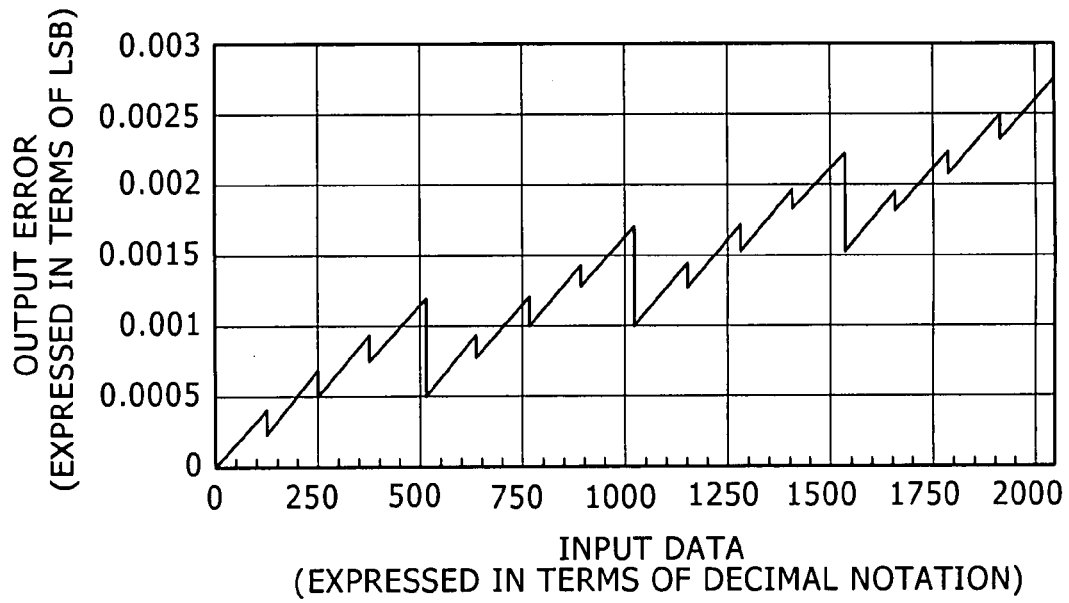
FIG. 7 is a diagram illustrating a relationship between an output error and an input binary code of the digital/analog conversion circuit.

FIG. 7 illustrates a relationship between the output error and the binary code Din in the digital/analog conversion circuit according to the present embodiment where the bit length L of the binary code Din is "11" and the mismatch in electrostatic capacitance is 0.2%. The axis of abscissa indicates the value of the binary code Din (input data) represented in decimal notation, and the axis of ordinate indicates the error of the output voltage normalized with the voltage value $V_{ref}/2^{L+1}$ of 1 LSB.

As can be recognized from FIGS. 16 and 7, the output error of the digital/analog conversion circuit according to the present embodiment is smaller by more than two digits when compared with that of the existing basic cyclic DAC. Where the mismatch in electrostatic capacitance is 0.2%, the ENOB of the digital/analog conversion circuit according to the present embodiment is approximately 18 bits, which is as high as twice that of the basic cyclic DAC.

Figure 8:
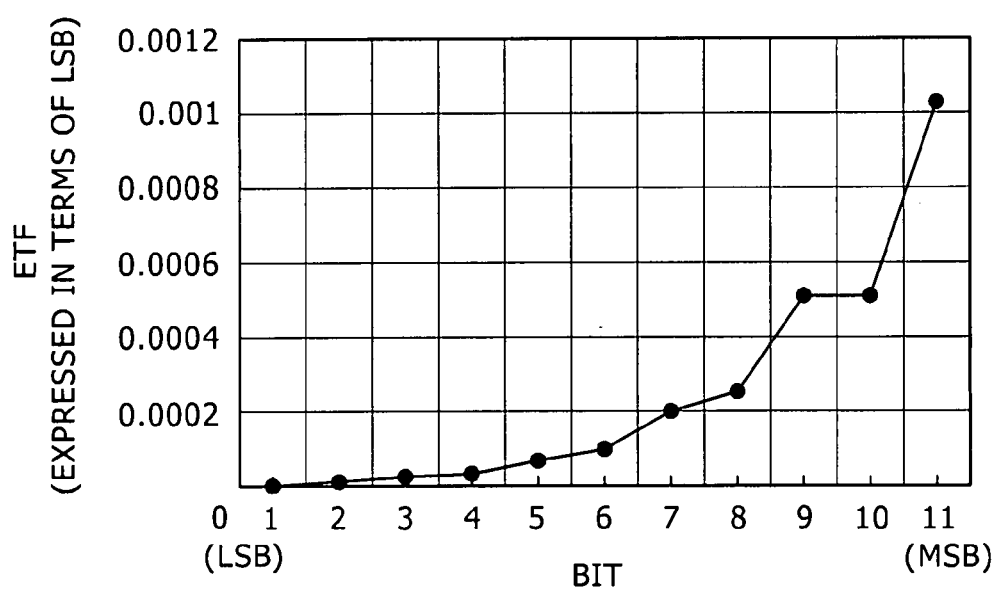
FIG. 8 is a diagram illustrating an error transfer function of the digital/analog conversion circuit.

FIG. 8 illustrates the ETF of the digital/analog conversion circuit according to the present embodiment in the same conditions as those in FIG. 7. The axis of abscissa indicates the bit from the first bit to the eleventh bit, and the axis of ordinate indicates the error of the output voltage normalized with the voltage value $V_{ref}/2^{L+1}$ of 1 LSB.

As can be seen from comparison between FIGS. 2 and 8, the ETF of the digital/analog conversion circuit according to the present embodiment is much lower than that of the existing basic cyclic DAC.

Now, modifications to the digital/analog conversion circuit according to the present embodiment are described.

First, a first modification is described with reference to FIG. 9.

Figure 9:
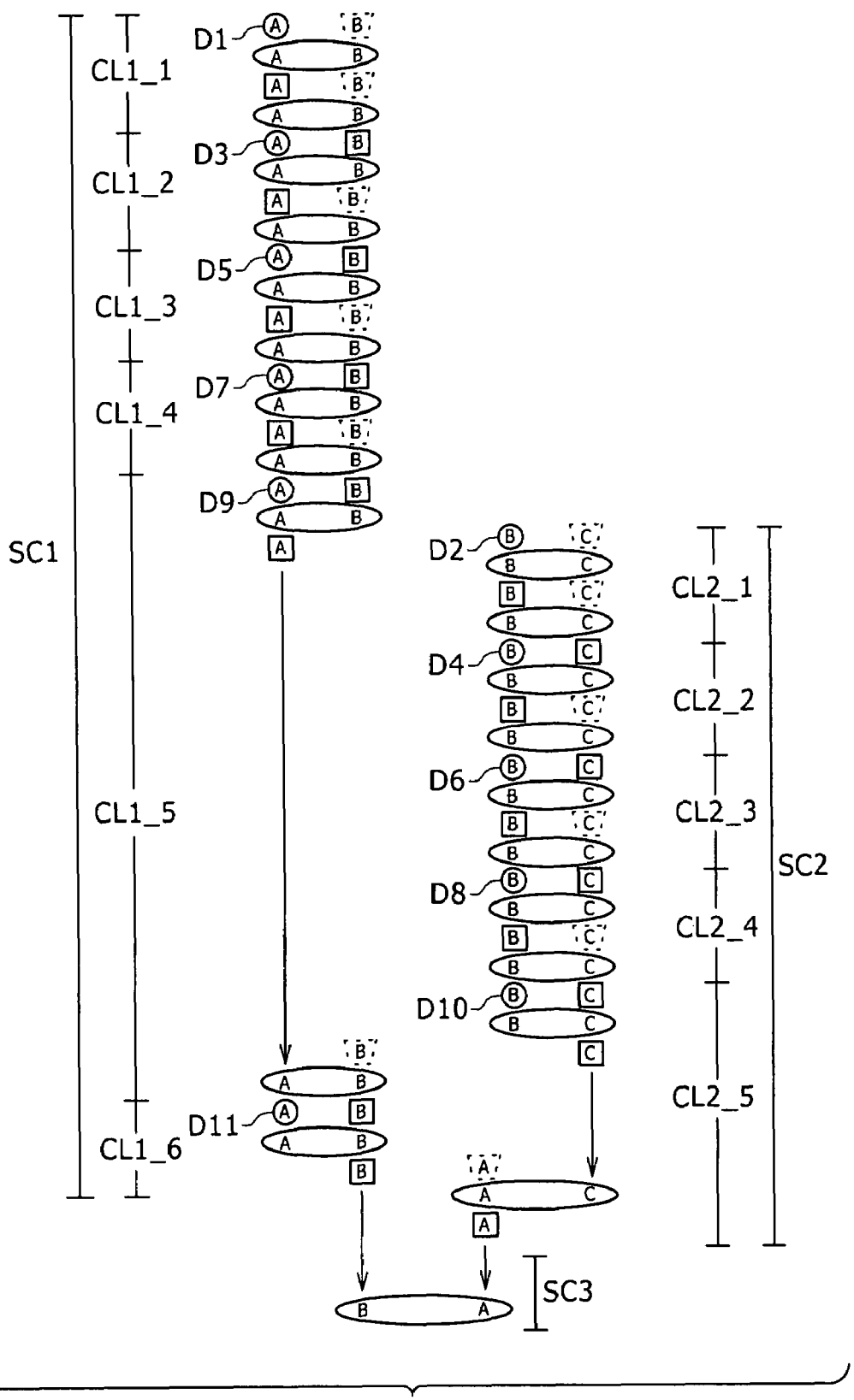
FIG. 9 is a flow diagram showing a first modification to the digital/analog conversion circuit.

FIG. 9 illustrates a modification to the operation sequence of the digital/analog conversion circuit having the configuration described hereinabove with reference to FIG. 1.

In the operation sequence illustrated in FIG. 5, the operation cycles CL1_1 to CL1_6 of the first sequence SC1 and the operation cycles CL2_1 to CL2_5 of the second sequence SC2 are executed alternately. In contrast, in the operation sequence illustrated in FIG. 9, the operation cycles CL2_1 to CL2_5 of the second sequence SC2 are executed while charge retaining of the capacitor C1 is performed in the operation cycle CL1_5 of the first sequence SC1.

Since the first sequence SC1 and the second sequence SC2 are independent of each other with regard to the process of sample charge, if the capacitor C2 which is used in the two sequences can be shared appropriately, then the two sequences can be executed in an arbitrary order.

Now, a second modification is described with reference to FIG. 10.

Figure 10:
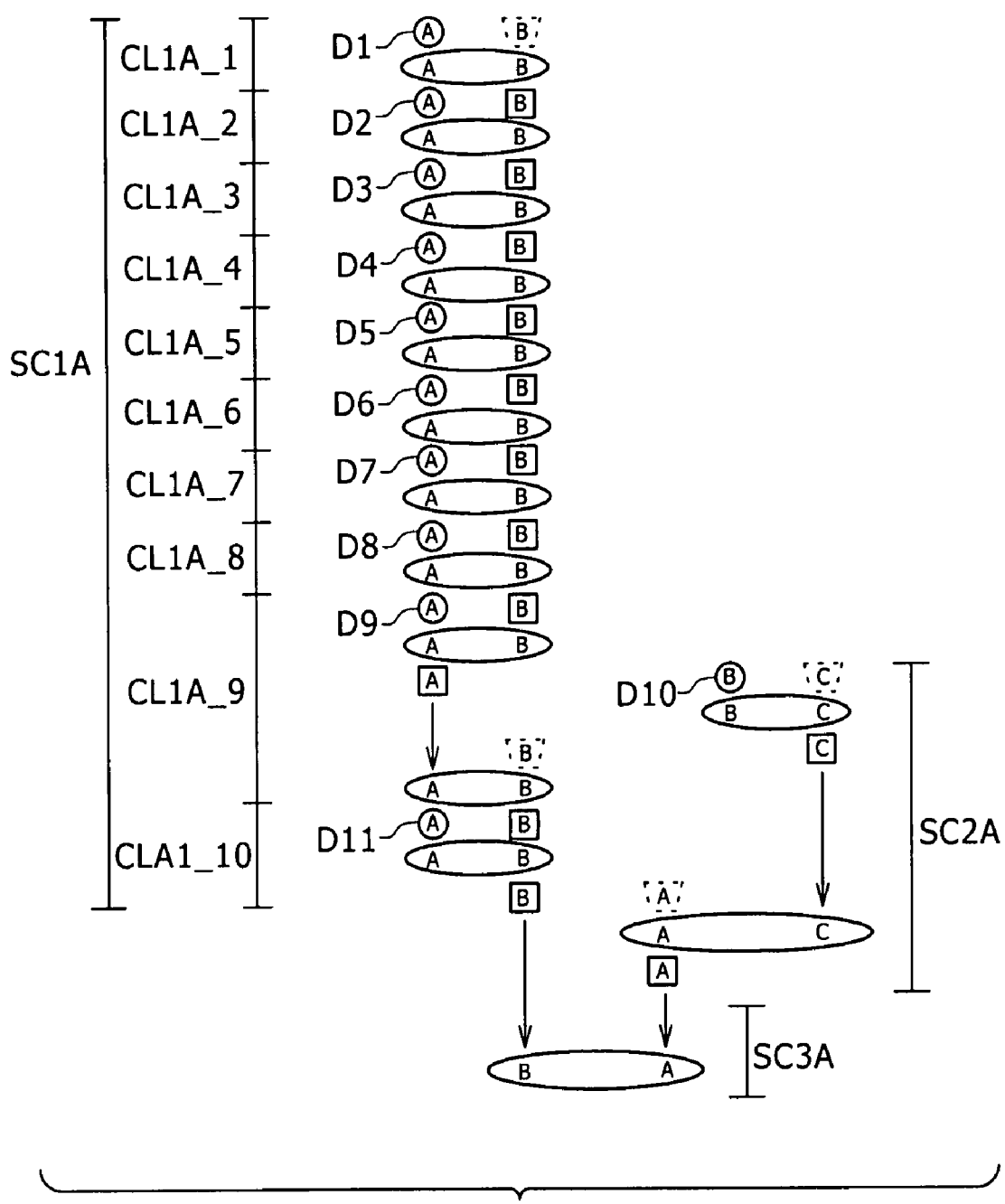
FIG. 10 is a flow diagram showing a second modification to the digital/analog conversion circuit.

FIG. 10 illustrates another modification to the operation sequence of the digital/analog conversion circuit having the configuration described hereinabove with reference to FIG. 1.

The operation sequences illustrated in FIGS. 5 and 9 may require a period of conversion time approximately equal to twice that of the basic cyclic DAC (FIG. 13) of the same bit length. In most cases, the problem can be solved within an allowable range or by raising the clock rate.

On the other hand, if the required ENOB is not very high, then it is possible to reduce the conversion time by simplifying part of the operation sequence illustrated in FIG. 5 or 9. As can be seen from the graph of FIG. 2, the ETF exhibits a decreasing value toward the LSB. Accordingly, if the operation sequence of FIG. 5 or 9 is applied only to some higher order bits so as to satisfy the conditions for the cyclic rational expression described hereinabove while an existing simple flow is applied to the remaining lower order bits, then the conversion time can be reduced without allowing the output error to become very great.

The operation sequence illustrated in FIG. 10 includes a first sequence SC1A for processing sample charge of the first bit D1, . . . , ninth bit D9 and eleventh bit D11, a second sequence SC2A for processing sample charge of the tenth bit D10, and a third sequence SC3A for collecting the charge processed by the two sequences SC1A and SC2A into the common capacitor (C1, C2).

The first sequence SC1A includes 10 operation cycles CL1A_1 to CL1A_10. In the operation cycles CL1A_9 and CL1A_10 from among the operation cycles CL1A_1 to CL1A_10, the same processes as those in the operation cycles CL1_5 and CL1_6 in FIG. 6, respectively.

In the second sequence SC2A, the same process as that of the operation cycle CL2_5 in FIG. 6 is executed.

In the third sequence SC3A, the same process as that of the third sequence SC3 in FIG. 6 is executed.

Accordingly, the operation sequence illustrated in FIG. 10 replaces the operation cycles CL1_1 to CL1_4 and CL2_1 to CL2_4 shown in FIG. 6 with the simpler operation cycles CL1A_1 to CL1A_8. In particular, sample charge of the low order 8 bits D1 to D8 is processed by simpler processes.

In the operation cycle CL1A_1, a voltage is applied to the capacitor C1 (electrostatic capacitance A) as a sampling operation of the first bit D1 (LSB), and charge resetting of the capacitor C2 (electrostatic capacitance B) is performed. Then, charge sharing is performed by parallel connection of the capacitors C1 and C2, and charge retaining of the capacitor C2 is performed after the charge sharing.

In the operation cycles CL1A_2 to CL1A_8, a sampling operation of the second bit D2, . . . , eighth bit D8 is performed, and a voltage corresponding to the bit value is applied to the capacitor C1. Then, the capacitor C2 into which charge is retained at the last end of the preceding operation cycle and the capacitor C1 to which the voltage is applied by the sampling operation described above are connected in parallel to perform charge sharing between the capacitors C1 and C2. After the charge sharing, charge retaining of the capacitor C2 is performed.

If FIGS. 5 and 10 are compared with each other, then while the operation sequence illustrated in FIG. 5 may require 44 steps, the operation sequence illustrated in FIG. 10 may require 28 steps and is smaller in number by 16 steps than that of the operation sequence of FIG. 5.

Now, a third modification is described with reference to FIG. 11.

Figure 11:
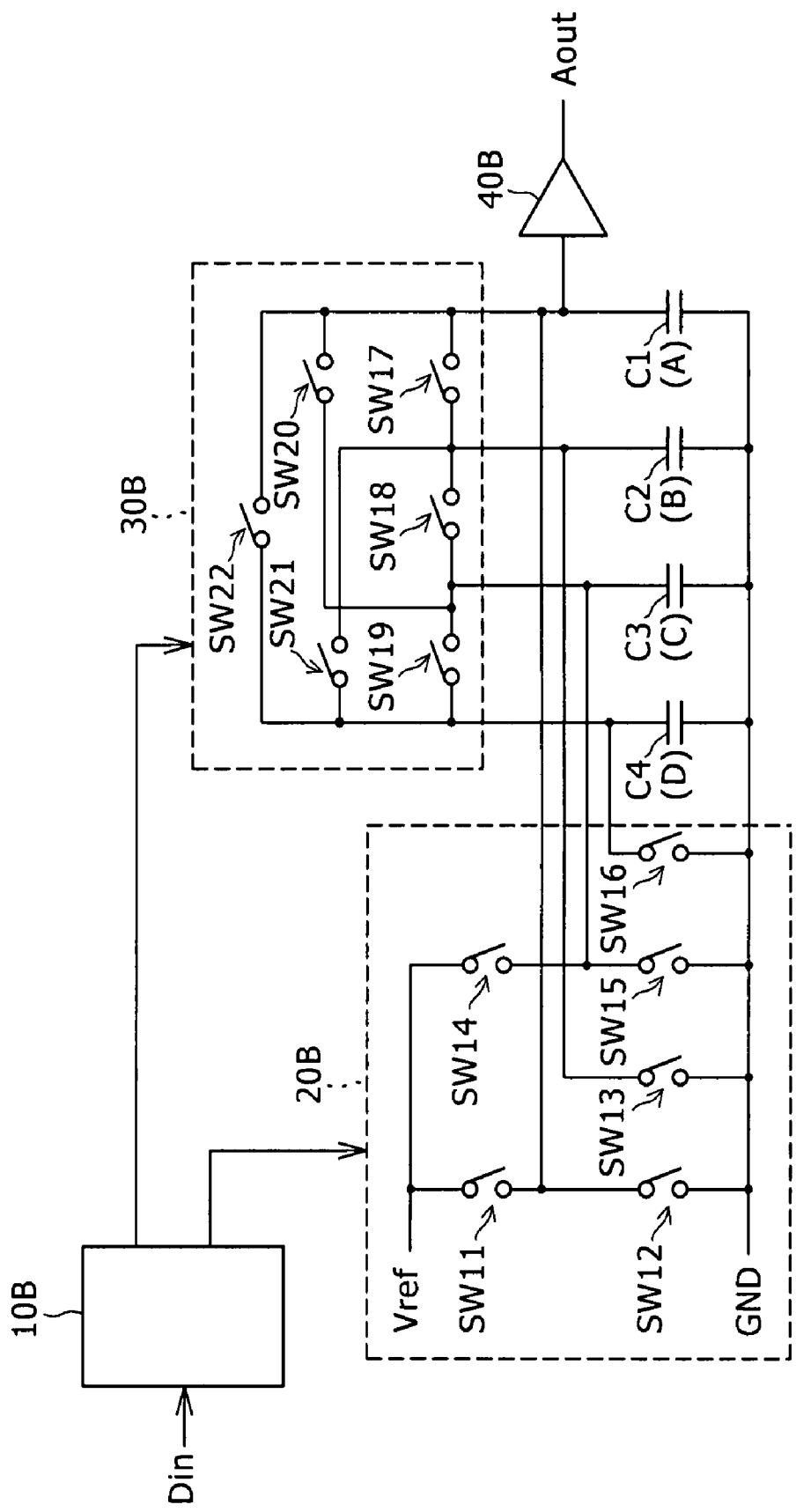
FIG. 11 is a circuit diagram showing a third modification to the digital/analog conversion circuit.

FIG. 11 shows another example of a configuration of the digital/analog conversion circuit according to the present embodiment.

While the digital/analog conversion circuit described hereinabove with reference to FIG. 1 uses three capacitors to implement an operation sequence which satisfies the condition for a cyclic rational expression, the digital/analog conversion circuit shown in FIG. 11 implements the operation sequence using four capacitors.

The digital/analog conversion circuit shown in FIG. 11 includes capacitors C1, C2, C3 and C4, a control circuit 10B, a voltage application circuit 20B, a connection circuit 30B and a buffer amplifier 40B.

The capacitors C1, C2, C3 and C4 have electrostatic capacitances A, B, C and D, respectively. The electrostatic capacitances A, B, C and D have values substantially equal to one another.

The voltage application circuit 20B applies the reference voltage $V_{ref}$ or the zero voltage individually to the capacitors C1, C2, C3 and C4 under the control of the control circuit 10B.

The voltage application circuit 20B shown in FIG. 11 includes switches SW11 to SW16.

One of terminals of each of the capacitors C1, C2, C3 and C4 and one of terminals of each of the switches SW12, SW13, SW15 and SW16 are connected commonly to the ground GND. One of terminals of each of the switches SW11 and SW14 is connected commonly to the reference voltage $V_{ref}$. The switch SW12 is connected in parallel to the capacitor C1 and connected in series to the switch SW11. The switch SW13 is connected in parallel to the capacitor C2. The switch SW15 is connected in parallel to the capacitor C3 and connected in series to the switch SW14. The switch SW16 is connected in parallel to the capacitor C4.

If the switch SW11 is set to an on state and the switch SW12 is set to an off state by the control circuit 10B, then the reference voltage $V_{ref}$ is applied to the capacitor C1. On the contrary, if the switch SW11 is set to an off state and the switch SW12 is set to an on state, then the zero voltage is applied to the capacitor C1, or in other words, the opposite terminals of the capacitor C1 are short-circuited. If both of the switches SW11 and SW12 are set to an off state, then the application of a voltage to the capacitor C1 is stopped.

If the switch SW14 is set to an on state and the switch SW15 is set to an off state by the control circuit 10B, then the reference voltage $V_{ref}$ is applied to the capacitor C3. On the contrary, if the switch SW14 is set to an off state and the switch SW15 is set to an on state, then the zero voltage is applied to the capacitor C3, or in other words, the opposite terminals of the capacitor C3 are short-circuited. If both of the switches SW14 and SW15 are set to an off state, then the application of a voltage to the capacitor C3 is stopped.

If the switch SW13 is set to an on state by the control circuit 10B, then the zero voltage is applied to the capacitor C2, that is, the opposite terminals of the capacitor C2 are short-circuited. If the switch SW13 is set to an off state, then the application of a voltage to the capacitor C2 is stopped.

If the switch SW16 is set to an on state by the control circuit 10B, then the zero voltage is applied to the capacitor C4, that is, the opposite terminals of the capacitor C4 are short-circuited. If the switch SW16 is set to an off state, then the application of a voltage to the capacitor C4 is stopped.

The connection circuit 30B selects a capacitor pair from among the capacitors C1, C2, C3 and C4 and connects the selected capacitors in parallel under the control of the control circuit 10B.

In the digital/analog conversion circuit shown in FIG. 11, the connection circuit 30B includes switches SW17 to SW22.

The switches SW17 to SW22 are connected between those terminals of the capacitors C1, C2, C3 and C4 which are not connected to the ground GND. In particular, the switch SW17 is connected between the terminals of the capacitors C1 and C2; the switch SW18 between the terminals of the capacitors C2 and C3; the switch SW19 between the terminals of the capacitors C3 and C4; the switch SW20 between the terminals of the capacitors C1 and C3; the switch SW21 between the terminals of the capacitors C2 and C4; and the switch SW22 between the terminals of the capacitors C1 and C4.

When the switch SW17 is set to an on state and the switches SW18, SW20, SW21 and SW22 are set to an off state by the control circuit 10B, the capacitors C1 and C2 are connected in parallel.

When the switch SW18 is set to an on state and the switches SW17, SW19, SW20 and SW21 are set to an off state by the control circuit 10B, the capacitors C2 and C3 are connected in parallel.

When the switch SW19 is set to an on state and the switches SW18, SW20, SW21 and SW22 are set to an off state by the control circuit 10B, the capacitors C3 and C4 are connected in parallel.

When the switch SW20 is set to an on state and the switches SW17, SW18, SW19 and SW22 are set to an off state by the control circuit 10B, the capacitors C1 and C3 are connected in parallel.

When the switch SW21 is set to an on state and the switches SW17, SW18, SW19 and SW22 are set to an off state by the control circuit 10B, the capacitors C2 and C4 are connected in parallel.

When the switch SW22 is set to an on state and the switches SW17, SW19, SW20 and SW21 are set to an off state by the control circuit 10B, the capacitors C1 and C4 are connected in parallel.

The buffer amplifier 40B generates a signal Aout corresponding to a voltage generated across the capacitor C1 and outputs the signal Aout as a digital/analog conversion result.

The control circuit 10B controls the voltage application circuit 20B and the connection circuit 30B in accordance with a predetermined operation sequence to generate a voltage corresponding to the value of the binary code Din of the bit length L (L is an integer equal to or greater than 3) across the capacitor C1.

The operation sequence of the control circuit 10B includes four operations, that is, a sampling operation, a charge sharing operation, a charge retaining operation and a charge resetting operation similar to those described hereinabove.

It is to be noted that the control circuit 10B can connect two capacitor pairs in parallel at the same time in the charge sharing operation. For example, while the capacitors C1 and C2 are connected in parallel, the capacitors C3 and C4 can be connected in parallel at the same time. In this instance, the control circuit 10B may set the switches SW17 and SW19 to an on state and set the switches SW18, SW20, SW21 and SW22 to an off state.

Figure 12:
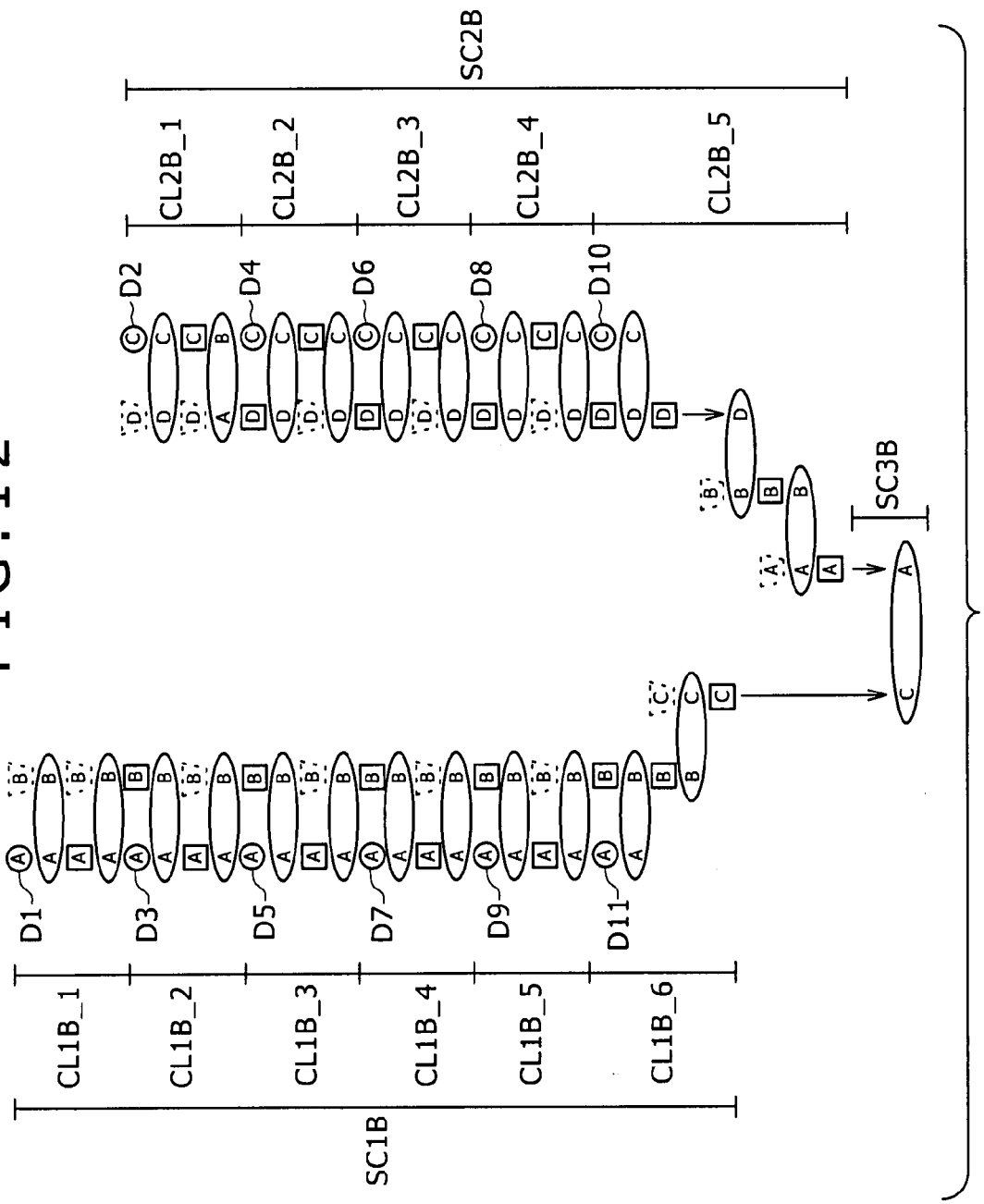
FIG. 12 is a flow diagram illustrating an example of an operation sequence of the digital/analog conversion circuit of FIG. 11.

FIG. 12 is a flow diagram illustrating an example of the operation sequence of the digital/analog conversion circuit shown in FIG. 11 where the bit length L of the binary code Din is "11".

The operation sequence illustrated in FIG. 12 includes three sequences SC1B, SC2B and SC3B. In the first sequence SCLB, sample charge of the odd-numbered bits D1, D3, . . . , D9, D11 is processed. In the second sequence SC2B, sample charge of the even-numbered bits D2, D4, . . . , D8, D10 is processed. In the third sequence SC3B, the sample charge processed in the sequence SC1B and SC2B is collected by a common capacitor (C1, C3). The sequences mentioned are described below individually.

The first sequence SC1B includes operation cycles CL1B_1 to CL1B_6 as seen in FIG. 12. In the operation cycles CL1B_2 to CL1B_5 among the operation cycles CL1B_1 to CL1B_6, the same process is repeated.

In the operation cycle CL1B_1, a sampling operation of the first bit D1 (LSB) is performed, and a voltage corresponding to the value of the first bit D1 is applied to the capacitor C1 (electrostatic capacitance A). Further, concurrently with the sampling operation, charge resetting of the capacitor C2 (electrostatic capacitance B) is performed. Then, charge sharing is performed by parallel connection of the capacitors C1 and C2, and thereafter, charge retaining of the capacitor C1 and charge resetting of the capacitor C2 are performed. Then, charge sharing is performed again by parallel connection of the capacitors C1 and C2, and charge retaining of the capacitor C2 is performed after the charge sharing.

In the operation cycles CL1B_2, CL1B_3, CL1B_4 and CL1B_5, a sampling operation of the third bit D3, fifth bit D5, seventh bit D7 and ninth bit D9 is performed, respectively. By each of the sampling operations, a voltage corresponding to the value of the pertaining bit is applied to the capacitor C1. Thereafter, the capacitor C2 into which charge is retained at the last end of the preceding operation cycle and the capacitor C1 to which the voltage is applied by the sampling operation described above are connected in parallel to perform charge sharing between the capacitors C1 and C2. After the charge sharing, charge retaining of the capacitor C1 and charge resetting of the capacitor C2 are performed. Thereafter, charge sharing is performed again by parallel connection of the capacitors C1 and C2, and charge retaining of the capacitor C2 is performed after the charge sharing.

In the operation cycle CL1B_6, a sampling operation of the eleventh bit D11 (MSB) is performed, and a voltage corresponding to the value of the eleventh bit D11 is applied to the capacitor C1. Then, the capacitor C2 into which charge is retained at the last end of the preceding operation cycle CL1B_5 and the capacitor C1 to which the voltage is applied by the sampling operation described above are connected in parallel to perform charge sharing between the capacitors C1 and C2. After the charge sharing, charge retaining of the capacitor C2 and charge resetting of the capacitor C3 (electrostatic capacitance C) are performed. Thereafter, charge sharing is performed by parallel connection of the capacitors C2 and C3, and then charge retaining of the capacitor C3 is performed after the charge sharing.

The second sequence SC2B includes operation cycles CL2B_1 to CL2B_5 as seen in FIG. 12. In the operation cycles CL2B_2 to CL2B_4 among the operation cycles CL2B_1 to CL2B_5, the same process is repeated.

In the operation cycle CL2B_1, a sampling operation of the second bit D2 is performed, and a voltage corresponding to the value of the second bit D2 is applied to the capacitor C3 (electrostatic capacitance C). Concurrently with the sampling operation, charge resetting of the capacitor C4 (electrostatic capacitance D) is performed. Then, charge sharing is performed by parallel connection of the capacitors C3 and C4, and thereafter, charge retaining of the capacitor C3 and charge resetting of the capacitor C4 are performed. Then, charge sharing is performed again by parallel connection of the capacitors C3 and C4, and charge retaining of the capacitor C4 is performed after the charge sharing.

In the operation cycles CL2B_2, CL2B_3 and CL2B_4, sampling operations of the fourth bit D4, sixth bit D6 and eighth bit D8 are performed, respectively. By each of the sampling operations, a voltage corresponding to the value of the pertaining bit is applied to the capacitor C3. Thereafter, the capacitor C4 into which charge is retained at the last end of the preceding operation cycle and the capacitor C3 to which the voltage is applied by the sampling operation described above are connected in parallel to perform charge sharing between the capacitors C3 and C4. After the charge sharing, charge retaining of the capacitor C3 and charge resetting of the capacitor C4 are performed. Thereafter, charge sharing is performed by parallel connection of the capacitors C3 and C4 again, and charge retaining of the capacitor C4 is performed after the charge sharing.

In the operation cycle CL2B_5, a sampling operation of the tenth bit D10 is performed, and a voltage corresponding to the value of the tenth bit D10 is applied to the capacitor C3. Then, the capacitor C4 into which charge is retained at the last end of the preceding operation cycle CL2B_4 and the capacitor C3 to which the voltage is applied in the sampling operation described above are connected to each other to perform charge sharing between the capacitors C4 and C3. After the charge sharing, charge retaining of the capacitor C4 and charge resetting of the capacitor C2 (electrostatic capacitance B) are performed. Thereafter, charge sharing is performed by parallel connection of the capacitors C4 and C2, and charge retaining of the capacitor C2 and charge resetting of the capacitor C1 (electrostatic capacitance A) are performed after the charge sharing. Further, charge sharing is performed by parallel connection of the capacitors C1 and C2, and charge retaining of the capacitor C1 is performed after the charge sharing.

In the third sequence SC3B, the capacitor C3 into which charge is retained at the last end of the first sequence SC1B and the capacitor C1 into which charge is retained at the last end of the second sequence SC2B are connected in parallel to perform charge sharing between the capacitors C1 and C3. Consequently, sample charge of the odd-numbered bits D1, D3, ..., D9, D11 processed in the first sequence SC1B and sample charge of the even-numbered bits D2, D4, ..., D8, D10 processed in the second sequence SC2B are collected into a common capacitor (C1, C3).

By the operation sequence described hereinabove with reference to FIGS. 5 and 6, the ETFs of the odd-numbered bits D1, D3, ..., D9, D11 are represented by the following expressions (20-1) to (20-6):

$$E(11) = \frac{ABC}{(A+B)(B+C)(C+A)} - \frac{1}{2^3} \quad (20\text{-}1)$$

$$E(9) = \frac{(ABC)(AB)}{\{(A+B)(B+C)(C+A)\}\{(A+B)(B+A)\}} - \frac{1}{2^5} \quad (20\text{-}2)$$

$$E(7) = \frac{(ABC)(AB)^2}{\{(A+B)(B+C)(C+A)\}\{(A+B)(B+A)\}^2} - \frac{1}{2^7} \quad (20\text{-}3)$$

$$E(5) = \frac{(ABC)(AB)^3}{\{(A+B)(B+C)(C+A)\}\{(A+B)(B+A)\}^3} - \frac{1}{2^9} \quad (20\text{-}4)$$

$$E(3) = \frac{(ABC)(AB)^4}{\{(A+B)(B+C)(C+A)\}\{(A+B)(B+A)\}^4} - \frac{1}{2^{11}} \quad (20\text{-}5)$$

$$E(1) = \frac{(ABC)(AB)^5}{\{(A+B)(B+C)(C+A)\}\{(A+B)(B+A)\}^5} - \frac{1}{2^{13}} \quad (20\text{-}6)$$

Meanwhile, the ETFs of the even-numbered bits D2, D4, ..., D8, D10 are represented by the following expressions (21-1) to (21-5):

$$E(10) = \frac{CDBA}{(C+D)(D+B)(B+A)(A+C)} - \frac{1}{2^4} \quad (21\text{-}1)$$

$$E(8) = \frac{(CDBA)(CD)}{\{(C+D)(D+B)(B+A)(A+C)\}\{(C+D)(D+C)\}} - \frac{1}{2^6} \quad (21\text{-}2)$$

$$E(6) = \frac{(CDBA)(CD)^2}{\{(C+D)(D+B)(B+A)(A+C)\}\{(C+D)(D+C)\}^2} - \frac{1}{2^8} \quad (21\text{-}3)$$

$$E(4) = \frac{(CDBA)(CD)^3}{\{(C+D)(D+B)(B+A)(A+C)\}\{(C+D)(D+C)\}^3} - \frac{1}{2^{10}} \quad (21\text{-}4)$$

$$E(6) = \frac{(CDBA)(CD)^4}{\{(C+D)(D+B)(B+A)(A+C)\}\{(C+D)(D+C)\}^4} - \frac{1}{2^{12}} \quad (21\text{-}5)$$

As can be recognized from the expressions (20-1) to (20-6) and (21-1) to (21-5), also in the operation sequence illustrated in FIG. 12, the first term of the ETF becomes a cyclic rational expression with regard to all bits and exhibits a very small amount of a high order with regard to a mismatch in electrostatic capacitance. Accordingly, similarly to the operation sequence illustrated in FIG. 5, the ENOB can be enhanced.

Further, according to the operation sequence illustrated in FIG. 12, the number of times of a charge sharing operation for sample charge is larger by one when compared with that of the operation sequence illustrated in FIG. 5, and the output voltage generated in the capacitor C1 is reduced to one half.

However, since two different flows of charge sharing operations can be executed simultaneously, a higher conversion speed can be anticipated when compared with that of the operation sequence illustrated in FIG. 5. For example, when digital/analog conversion of 11 bits is to be performed, while the operation sequence illustrated in FIG. 5 may require 44 steps, the operation sequence illustrated in FIG. 12 may require 30 steps and is smaller in number by 14 steps than that of the operation sequence of FIG. 5.

While an embodiment of the present invention is described above, the present invention is not limited to the embodiment described above.

For example, while, in the embodiment described above, the bit length is "11", the bit length is not limited to this, and the present invention can be applied to a digital/analog conversion circuit of an arbitrary bit length.

Further, while, in the embodiment described above, the zero voltage is applied to a capacitor in a sampling operation and a charge resetting operation, the present invention is not limited to this. In particular, a fixed voltage different from the reference voltage $V_{ref}$ may be applied to a capacitor in place of the zero voltage.

Further, the flow diagram technique (FIG. 5 and so forth) used in the description of the embodiment is useful to analysis and design of a circuit which performs an averaging operation (multiplication by ½) under a condition that a mismatch exists in a characteristic of elements. Accordingly, the present flow diagram technique can be applied widely to descriptions of an operation sequence of a circuit which includes arbitrary circuit elements such as a resistor and a current source as well as a capacitor.

What is claimed is:

1. A digital/analog conversion circuit, comprising:
   a plurality of capacitors having electrostatic capacitances substantially equal to each other;
   a voltage application section configured to apply a first voltage or a second voltage to each of said capacitors;
   a connection section configured to select a capacitor pair from among said capacitors and connect the selected capacitors in parallel; and
   a control section configured to control said voltage application section and said connection section in accordance with a predetermined operation sequence including a voltage application operation of applying the first voltage or the second voltage to one of said capacitors in response to the value of a Kth digit of a binary code of a bit length L, L being an integer equal to or greater than three, K being an integer within a range from one to L wherein the first digit is the least significant bit of the binary code, a charge sharing operation of connecting two ones of said capacitors including the one capacitor in parallel to share the charge accumulated in the one capacitor to the two capacitors, a charge retaining operation of disconnecting the two capacitors connected in parallel from each other and retaining the charge accumulated in the other one of the two capacitors, and an initialization operation of initializing the voltage of the one capacitor to the second voltage;
   said control section being operable to perform the charge sharing operation by (L−K+N) times for the charge supplied from said voltage application section by the voltage application operation for the Kth digit of the binary code, N being an integer equal to or greater than two, and to collect the charge supplied from said voltage application section by the voltage application operations for the digits of the binary code into a common one of said capacitors before the last charge sharing operation of the operation sequence;
   said control section setting, for at least M higher order ones of the digits of the binary code, the number of times by which the one capacitor takes part in the charge sharing operation within a series of operations before the charge supplied from said voltage application section by the voltage application operation is shared by the last charge sharing operation to twice the number of times by which the one capacitor takes part in the voltage application operation or the charge retaining operation, M being an integer equal to or greater than two.

2. The digital/analog conversion circuit according to claim 1, wherein said capacitors include a first capacitor, a second capacitor and a third capacitor and the predetermined operation sequence includes a first sequence, a second sequence and a third sequence, and
   in the first sequence, said control section
   applies a voltage to said first capacitor by the voltage application operation for the (L−2)th digit of the binary code,
   performs, after the voltage application, charge sharing by parallel connection of said first capacitor and said second capacitor,
   performs, after the charge sharing operation, charge retaining of said first capacitor and initialization of said second capacitor,
   performs, after the initialization operation, charge sharing by parallel connection of said first capacitor and said second capacitor,
   performs, after the charge sharing operation, application of a voltage to said first capacitor by the voltage application operation for the Lth digit of the binary code and charge retaining of said second capacitor,
   performs, after the voltage application operation, charge sharing by parallel connection of said first capacitor and said second capacitor, and
   performs, after the charge sharing operation, charge retaining of said second capacitor;
   in the second sequence, said control section
   performs application of a voltage to said second capacitor by the voltage application operation for the (L−1)th digit of the binary code,
   performs, after the voltage application operation, charge sharing by parallel connection of said second capacitor and said third capacitor,
   performs, after the charge sharing operation, charge retaining of said third capacitor and initialization of said first capacitor,
   performs, after the initialization operation, charge sharing by parallel connection of said third capacitor and said first capacitor, and
   performs, after the charge sharing operation, charge retaining of said first capacitor; and
   in the third sequence, said control section performs charge sharing by parallel connection of said second capacitor into which the charge is retained at the last end of the first sequence and the first capacitor into which the charge is retained at the last end of the second sequence.

3. The digital/analog conversion circuit according to claim 2, wherein each of the first sequence and the second sequence includes a plurality of operation cycles, and
   in the operation cycles of the first sequence, said control section
   applies a voltage to said first capacitor by a voltage application operation for the (L−I)th digit of the binary code, I being a positive even number smaller than L, performs, after the voltage application operation, charge sharing by parallel connection of said second capacitor into which the charge is retained at the last end of the preceding operation cycle or said second capacitor initialized to the second voltage after the voltage application operation for the first digit or the second digit of the binary code and said first capacitor, performs, after the charge sharing operation, charge retaining of said first capacitor and initialization of said second capacitor, performs, after the initialization operation, charge sharing by parallel connection of said first capacitor and said second capacitor, and performs, after the charge sharing operation, charge retaining of said second capacitor; and in the operation cycles of the second sequence, said control section applies a voltage to said second capacitor by a voltage application operation for the (L−J)th digit of the binary code, J being a positive odd number smaller than L, performs, after the voltage application operation, charge sharing by parallel connection of said third capacitor into which the charge is retained at the last end of the preceding operation cycle or said third capacitor initialized to the second voltage after the voltage application operation for the first digit or the second digit of the binary code and said second capacitor, performs, after the charge sharing operation, charge retaining of said second capacitor and initialization of said third capacitor, performs, after the initialization operation, charge sharing by parallel connection of said second capacitor and said third capacitor, and performs, after the charge sharing operation, charge retaining of said third capacitor.

4. The digital/analog conversion circuit according to claim 1, wherein said capacitors include a first capacitor, a second capacitor, a third capacitor and a fourth capacitor and the predetermined operation sequence includes a first sequence, a second sequence and a third sequence, and in the first sequence, said control section applies a voltage to said first capacitor by the voltage application operation for the (L−2)th digit of the binary code, performs, after the voltage application, charge sharing by parallel connection of said first capacitor and said second capacitor, performs, after the charge sharing operation, charge retaining of said first capacitor and initialization of said second capacitor, performs, after the initialization operation, charge sharing by parallel connection of said first capacitor and said second capacitor, performs, after the charge sharing operation, application of a voltage to said first capacitor by the voltage application operation for the Lth digit of the binary code and charge retaining of said second capacitor, performs, after the voltage application operation, charge sharing by parallel connection of said first capacitor and said second capacitor, performs, after the charge sharing operation, charge retaining of said second capacitor and initialization of said third capacitor, performs, after the initialization operation, charge sharing by parallel connection of said second capacitor and said third capacitor, and performs, after the charge sharing operation, charge retaining of said third capacitor;

in the second sequence, said control section performs application of a voltage to said third capacitor by the voltage application operation for the (L−1)th digit of the binary code, performs, after the voltage application operation, charge sharing by parallel connection of said third capacitor and said fourth capacitor, performs, after the charge sharing operation, charge retaining of said fourth capacitor and initialization of said second capacitor, performs, after the initialization operation, charge sharing by parallel connection of said fourth capacitor and said second capacitor, performs, after the charge sharing operation, charge retaining of said second capacitor and initialization of said first capacitor, performs, after the initialization operation, charge sharing by parallel connection of said second capacitor and said first capacitor, and performs, after the charge sharing operation, charge retaining of said first capacitor; and in the third sequence, said control section performs charge sharing by parallel connection of said third capacitor into which the charge is retained at the last end of the first sequence and said first capacitor into which the charge is retained at the last end of the second sequence.

5. The digital/analog conversion circuit according to claim 4, wherein each of the first sequence and the second sequence includes a plurality of operation cycles, and in the operation cycles of the first sequence, said control section applies a voltage to said first capacitor by a voltage application operation for the (L−I)th digit of the binary code, I being a positive even number smaller than L, performs, after the voltage application operation, charge sharing by parallel connection of said second capacitor into which the charge is retained at the last end of the preceding operation cycle or said second capacitor initialized to the second voltage after the voltage application operation for the first digit or the second digit of the binary code and said first capacitor, performs, after the charge sharing operation, charge retaining of said first capacitor and initialization of said second capacitor, performs, after the initialization operation, charge sharing by parallel connection of said first capacitor and said second capacitor, and performs, after the charge sharing operation, charge retaining of said second capacitor; and in the operation cycles of the second sequence, said control section applies a voltage to said third capacitor by a voltage application operation for the (L−J)th digit of the binary code, J being a positive odd number smaller than L, performs, after the voltage application operation, charge sharing by parallel connection of said fourth capacitor into which the charge is retained at the last end of the preceding operation cycle or said fourth capacitor initialized to the second voltage after the voltage application operation for the first digit or the second digit of the binary code and said third capacitor, performs, after the charge sharing operation, charge retaining of said third capacitor and initialization of said fourth capacitor, performs, after the initialization operation, charge sharing by parallel connection of said third capacitor and said fourth capacitor, and performs, after the charge sharing operation, charge retaining of said fourth capacitor.

* * * * *